US010844489B2

United States Patent
Iwasaki et al.

(10) Patent No.: US 10,844,489 B2
(45) Date of Patent: Nov. 24, 2020

(54) FILM FORMING APPARATUS AND SHOWER HEAD

(71) Applicant: Tokyo Electron Limited, Tokyo (JP)

(72) Inventors: Masahide Iwasaki, Miyagi (JP); Toshihisa Nozawa, Miyagi (JP); Kohei Yamashita, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 633 days.

(21) Appl. No.: 14/922,502

(22) Filed: Oct. 26, 2015

(65) Prior Publication Data

US 2016/0122873 A1    May 5, 2016

(30) Foreign Application Priority Data

Oct. 29, 2014   (JP) ................................ 2014-220479

(51) Int. Cl.
  *C23C 16/455*       (2006.01)
  *C23C 16/52*        (2006.01)
  (Continued)

(52) U.S. Cl.
  CPC .... *C23C 16/45565* (2013.01); *C23C 16/4584* (2013.01); *C23C 16/52* (2013.01); *H01J 37/3244* (2013.01); *H01J 37/32449* (2013.01)

(58) Field of Classification Search
  CPC .......... C23C 16/4409; C23C 16/45544; C23C 16/45557; C23C 16/45563;
  (Continued)

(56) References Cited

U.S. PATENT DOCUMENTS 6,089,472 A * 7/2000 Carter ................... C23C 16/455
                                                     239/422
6,428,850 B1 * 8/2002 Shinriki ................ C23C 16/405
                                                     118/715
(Continued)

FOREIGN PATENT DOCUMENTS

EP        2871038 A1 * 5/2015 .......... H05H 1/2406
JP     2013-087038 A    5/2013
(Continued)

*Primary Examiner* — Jeffrie R Lund
*Assistant Examiner* — Stanislav Antolin
(74) *Attorney, Agent, or Firm* — Abelman, Frayne & Schwab

(57) ABSTRACT

A film forming apparatus includes: a mounting table configured to place a substrate thereon and to be rotatable around an axis; a unit provided in a first region such that its bottom surface faces the mounting table and having first and second buffer spaces therein; and a flow rate controller that independently controls flow rates of a precursor gas supplied to the first and second buffer spaces. In the bottom surface, the unit includes: an inside injection section including injection ports communicated with the first buffer space and configured to inject the precursor gas supplied to the first buffer space; and an intermediate injection section including injection ports communicated with the second buffer space and configured to inject the precursor gas supplied to the second buffer space. All the first injection ports are provided at a location closer to the axis, as compared to the second injection ports.

15 Claims, 20 Drawing Sheets

(51) Int. Cl.
  *C23C 16/458* (2006.01)
  *H01J 37/32* (2006.01)
(58) Field of Classification Search
  CPC ........ C23C 16/45565; C23C 16/45574; C23C
              16/4584; C23C 16/52; H01J 37/3244;
              H01J 37/32449; H01L 21/67126; H01L
                              21/6719; H01L 21/68785
  See application file for complete search history.

(56) References Cited

U.S. PATENT DOCUMENTS

| | | | | |
|---|---|---|---|---|
| 6,736,633 | B1* | 5/2004 | Dawson-Elli | C03B 19/1423 239/418 |
| 10,145,014 | B2* | 12/2018 | Nozawa | H01J 37/32192 |
| 2001/0027026 | A1* | 10/2001 | Dhindsa | C23C 16/455 438/712 |
| 2004/0026374 | A1* | 2/2004 | Nguyen | H01L 21/67173 216/89 |
| 2004/0052972 | A1* | 3/2004 | Schmitt | C23C 16/4412 427/569 |
| 2004/0173159 | A1* | 9/2004 | Kuthi | H01J 37/32009 118/723 E |
| 2004/0187784 | A1* | 9/2004 | Sferlazzo | C23C 16/45508 118/719 |
| 2005/0133160 | A1* | 6/2005 | Kennedy | C23C 16/45565 156/345.34 |
| 2005/0241763 | A1* | 11/2005 | Huang | H01J 37/3244 156/345.33 |
| 2006/0021574 | A1* | 2/2006 | Armour | C23C 16/45565 118/715 |
| 2006/0042754 | A1* | 3/2006 | Yoshida | H01J 37/32091 156/345.1 |
| 2006/0066247 | A1* | 3/2006 | Koshiishi | H01L 21/67069 315/111.21 |
| 2006/0124169 | A1* | 6/2006 | Mizusawa | G05D 11/132 137/7 |
| 2006/0157445 | A1* | 7/2006 | Mochiki | H01J 37/3244 216/59 |
| 2006/0191637 | A1* | 8/2006 | Zajac | B81C 1/00547 156/345.34 |
| 2006/0196604 | A1* | 9/2006 | Moriya | C23F 4/00 156/345.34 |
| 2006/0288934 | A1* | 12/2006 | Takahashi | C23F 4/00 118/715 |
| 2007/0151668 | A1* | 7/2007 | Mizusawa | C23C 16/45557 156/345.29 |
| 2007/0181181 | A1* | 8/2007 | Mizusawa | C23C 16/45565 137/1 |
| 2007/0181255 | A1* | 8/2007 | Hayasaka | C23C 16/455 156/345.33 |
| 2007/0281089 | A1* | 12/2007 | Heller | C23C 16/45514 427/255.5 |
| 2008/0096369 | A1* | 4/2008 | Strzyzewski | C23C 16/45551 438/478 |
| 2008/0178805 | A1* | 7/2008 | Paterson | H01J 37/32091 118/723 I |
| 2008/0193673 | A1* | 8/2008 | Paterson | H01J 37/32091 427/569 |
| 2008/0223523 | A1* | 9/2008 | Handa | H01J 37/32091 156/345.44 |
| 2009/0061083 | A1* | 3/2009 | Chiang | C23C 16/45544 427/248.1 |
| 2009/0061644 | A1* | 3/2009 | Chiang | C23C 16/45544 438/763 |
| 2009/0117746 | A1* | 5/2009 | Masuda | C23C 16/45561 438/710 |
| 2010/0055319 | A1* | 3/2010 | Kato | C23C 16/45544 427/255.28 |
| 2010/0136795 | A1* | 6/2010 | Honma | C23C 16/45551 438/758 |
| 2010/0167551 | A1* | 7/2010 | DeDontney | B01J 19/0046 438/758 |
| 2010/0186669 | A1* | 7/2010 | Shin | C23C 16/45546 118/719 |
| 2010/0190341 | A1* | 7/2010 | Park | C23C 16/045 438/694 |
| 2010/0193471 | A1* | 8/2010 | Funk | C23C 16/4412 216/67 |
| 2010/0229797 | A1* | 9/2010 | Kato | C23C 16/402 118/730 |
| 2010/0263588 | A1* | 10/2010 | Zhiyin | C23C 16/45508 117/98 |
| 2010/0272895 | A1* | 10/2010 | Tsuda | C23C 16/409 427/255.32 |
| 2011/0048325 | A1* | 3/2011 | Choi | C23C 16/452 118/712 |
| 2011/0070740 | A1* | 3/2011 | Bettencourt | H01J 37/3244 438/710 |
| 2011/0081486 | A1* | 4/2011 | McCamy | C23C 16/4401 427/255.19 |
| 2011/0097491 | A1* | 4/2011 | Levy | C23C 16/45551 427/248.1 |
| 2011/0155056 | A1* | 6/2011 | Kato | C23C 16/45538 118/719 |
| 2011/0159187 | A1* | 6/2011 | Kato | C23C 16/45544 427/255.26 |
| 2012/0088030 | A1* | 4/2012 | Kato | C23C 16/45551 427/255.5 |
| 2012/0135145 | A1* | 5/2012 | Je | C23C 16/45565 427/248.1 |
| 2012/0152171 | A1* | 6/2012 | Lee | C23C 16/45551 118/730 |
| 2012/0152172 | A1* | 6/2012 | Hwang | C23C 16/45551 118/730 |
| 2012/0222615 | A1* | 9/2012 | Kato | H01L 21/68764 118/719 |
| 2012/0225207 | A1* | 9/2012 | Yudovsky | C23C 16/45551 427/255.5 |
| 2012/0247678 | A1* | 10/2012 | Takahashi | H01J 37/32009 156/345.44 |
| 2012/0263877 | A1* | 10/2012 | Strauch | C23C 16/4401 427/255.28 |
| 2012/0301616 | A1* | 11/2012 | Endo | C23C 16/45565 427/255.7 |
| 2012/0312231 | A1* | 12/2012 | Li | C23C 16/303 118/715 |
| 2013/0064977 | A1* | 3/2013 | Vermeer | C23C 16/45551 427/255.5 |
| 2013/0192761 | A1* | 8/2013 | Yudovsky | C23C 16/45551 156/345.55 |
| 2013/0206067 | A1* | 8/2013 | Kato | H01L 21/02104 118/719 |
| 2013/0260488 | A1* | 10/2013 | Kim | C23C 16/45508 438/26 |
| 2013/0299009 | A1* | 11/2013 | Jiang | F16L 53/00 137/334 |
| 2013/0319612 | A1* | 12/2013 | Su | H01J 37/32449 156/345.24 |
| 2014/0044887 | A1* | 2/2014 | Vermeer | C23C 16/4401 427/535 |
| 2014/0087567 | A1* | 3/2014 | Toyoda | C23C 16/44 438/782 |
| 2014/0174362 | A1* | 6/2014 | Kao | C23C 16/45565 118/723 R |
| 2014/0235003 | A1* | 8/2014 | Jung | H01L 27/32 438/34 |
| 2014/0242814 | A1* | 8/2014 | Karakawa | H01L 21/0217 438/792 |
| 2015/0007774 | A1* | 1/2015 | Iwasaki | C23C 16/45542 118/723 R |
| 2015/0007857 | A1* | 1/2015 | Kikuchi | B08B 9/00 134/1.1 |
| 2015/0030786 | A1* | 1/2015 | Coe | C23C 16/274 427/575 |
| 2015/0048739 | A1* | 2/2015 | Forster | H01J 37/32357 315/111.21 |
| 2015/0118415 | A1* | 4/2015 | Kato | C23C 16/50 427/569 |

(56) References Cited

U.S. PATENT DOCUMENTS

| | | | |
|---|---|---|---|
| 2015/0136028 A1* | 5/2015 | Park | C23C 16/45551 118/730 |
| 2015/0211119 A1* | 7/2015 | Ono | C23C 16/45565 118/725 |
| 2015/0211124 A1* | 7/2015 | Nozawa | H01J 37/32192 118/723 MW |
| 2015/0214009 A1* | 7/2015 | Glukhoy | H01J 37/3244 239/132.3 |
| 2015/0214013 A1* | 7/2015 | Glukhoy | H01J 37/32449 29/527.1 |
| 2015/0225848 A1* | 8/2015 | Han | H01L 21/68764 427/569 |
| 2015/0232993 A1* | 8/2015 | Iwao | C23C 16/45536 118/723 AN |
| 2015/0262792 A1* | 9/2015 | Bera | H01J 37/32128 315/111.21 |
| 2015/0275364 A1* | 10/2015 | Thompson | C23C 16/45544 427/532 |
| 2015/0345022 A1* | 12/2015 | Yudovsky | C23C 16/45551 438/14 |
| 2015/0376782 A1* | 12/2015 | Griffin | C23C 16/4584 118/712 |
| 2015/0380221 A1* | 12/2015 | Liu | C23C 16/45536 427/569 |
| 2016/0056021 A1* | 2/2016 | Tsujimoto | H01J 37/3244 438/710 |
| 2016/0122873 A1* | 5/2016 | Iwasaki | C23C 16/45565 118/719 |
| 2016/0138162 A1* | 5/2016 | Iwasaki | C23C 16/511 156/345.29 |
| 2016/0153086 A1* | 6/2016 | Kwak | C23C 16/45551 118/723 R |
| 2016/0172183 A1* | 6/2016 | Kamada | H01L 21/0217 438/792 |
| 2016/0189950 A1* | 6/2016 | Oyama | H01L 21/0217 438/763 |
| 2016/0289836 A1* | 10/2016 | Jansen | B29C 59/14 |
| 2016/0319422 A1* | 11/2016 | Kurita | H01L 51/5253 |
| 2016/0322218 A1* | 11/2016 | Fukiage | H01L 21/02274 |
| 2016/0362788 A1* | 12/2016 | Kurita | H01J 37/32715 |
| 2016/0362789 A1* | 12/2016 | Yoshikawa | C23C 16/45551 |
| 2017/0183777 A1* | 6/2017 | Ikegawa | H01L 21/0217 |
| 2017/0183779 A1* | 6/2017 | Ikegawa | C23C 16/511 |
| 2018/0037992 A1* | 2/2018 | Fukiage | C23C 16/45529 |

FOREIGN PATENT DOCUMENTS

| | | | |
|---|---|---|---|
| JP | 2013087038 A * | 5/2013 | |
| JP | 2014-027052 A | 2/2014 | |
| JP | 2014027052 A * | 2/2014 | H01J 37/32192 |
| TW | 201423865 A | 6/2014 | |
| WO | WO-2012105832 A1 * | 8/2012 | C23C 16/4401 |
| WO | 2013-122043 A | 8/2013 | |
| WO | WO-2013122043 A1 * | 8/2013 | C23C 16/45542 |
| WO | WO-2014017132 A1 * | 1/2014 | H01J 37/32715 |
| WO | WO-2014130673 A1 * | 8/2014 | C23C 16/45551 |
| WO | 2014/142031 A | 9/2014 | |
| WO | WO-2014142031 A1 * | 9/2014 | C23C 16/4405 |
| WO | WO-2015016526 A1 * | 2/2015 | C23C 16/4584 |

* cited by examiner

FILM FORMING APPARATUS AND SHOWER HEAD

CROSS-REFERENCE TO RELATED APPLICATIONS

This application is based on and claims priority from Japanese Patent Application No. 2014-220479, filed on Oct. 29, 2014, with the Japan Patent Office, the disclosure of which is incorporated herein in its entirety by reference.

TECHNICAL FIELD

Various aspects and exemplary embodiments of the present disclosure relate to a film forming apparatus and a shower head.

BACKGROUND

As a kind of a method of forming a film on a substrate, a plasma enhanced atomic layer deposition (PE-ALD) method has been known. In the PE-ALD method, a substrate is exposed to a precursor gas so that the precursor gas containing a constituent element of a thin film is chemically adsorbed on the substrate. Subsequently, the substrate is exposed to a purge gas to remove the precursor gas that is excessively chemically adsorbed on the substrate. Then, the substrate is exposed to the plasma of a reaction gas containing a constituent element of the thin film to form a desired thin film on the substrate. In the PE-ALD method, the above-mentioned processes are repeated so that a film containing the atoms or molecules included in the precursor gas is generated on the substrate.

As one apparatus for implementing the PE-ALD method, a semi-batch type film forming apparatus has been known. In the semi-batch type film forming apparatus, a region for supplying a precursor gas and a region for generating the plasma of a reaction gas are provided as separate regions within a processing chamber, and a substrate sequentially passes through these regions so that a film with a desired thickness is generated on the substrate.

Such a film forming apparatus includes a mounting table, a shower head, and a plasma generating unit. The mounting table is configured to support the substrate, and rotates around a rotation shaft. The shower head and the plasma generating unit are disposed to face the mounting table, and are arranged in the circumferential direction. The shower head has substantially a fan shape in plan view, and is configured to supply a precursor gas to a substrate to be processed that passes through the underside of the shower head. The plasma generating unit supplies a reaction gas, and radiates microwaves supplied from a waveguide from a substantially fan-shaped antenna to generate the plasma of the reaction gas. An exhaust port is provided around the shower head and around the plasma generating unit, and injection ports for supplying a purge gas are provided at the periphery of the shower head. See, e.g., International Publication No. WO 2013/122043.

SUMMARY

A film forming apparatus disclosed herein includes: a mounting table configured to place a substrate to be processed ("substrate") thereon, and provided to be rotatable around an axis such that the substrate is moved around the axis; a shower head provided in one region among a plurality of regions, through which the substrate sequentially passes while moving in a circumferential direction around the axis due to rotation of the mounting table, such that a bottom surface of the shower head faces the mounting table, the shower head including at least a first buffer space and a second buffer space therein; and a flow rate controller configured to independently control a flow rate of a process gas to be supplied to each of the first buffer space and the second buffer space. The shower head further includes in the bottom surface thereof: a plurality of first injection ports communicated with the first buffer space and configured to downwardly inject the process gas supplied to the first buffer space; and a plurality of second injection ports communicated with the second buffer space and configured to downwardly inject the process gas supplied to the second buffer space, and all the first injection ports are provided at a location closer to the axis, as compared to the second injection ports.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
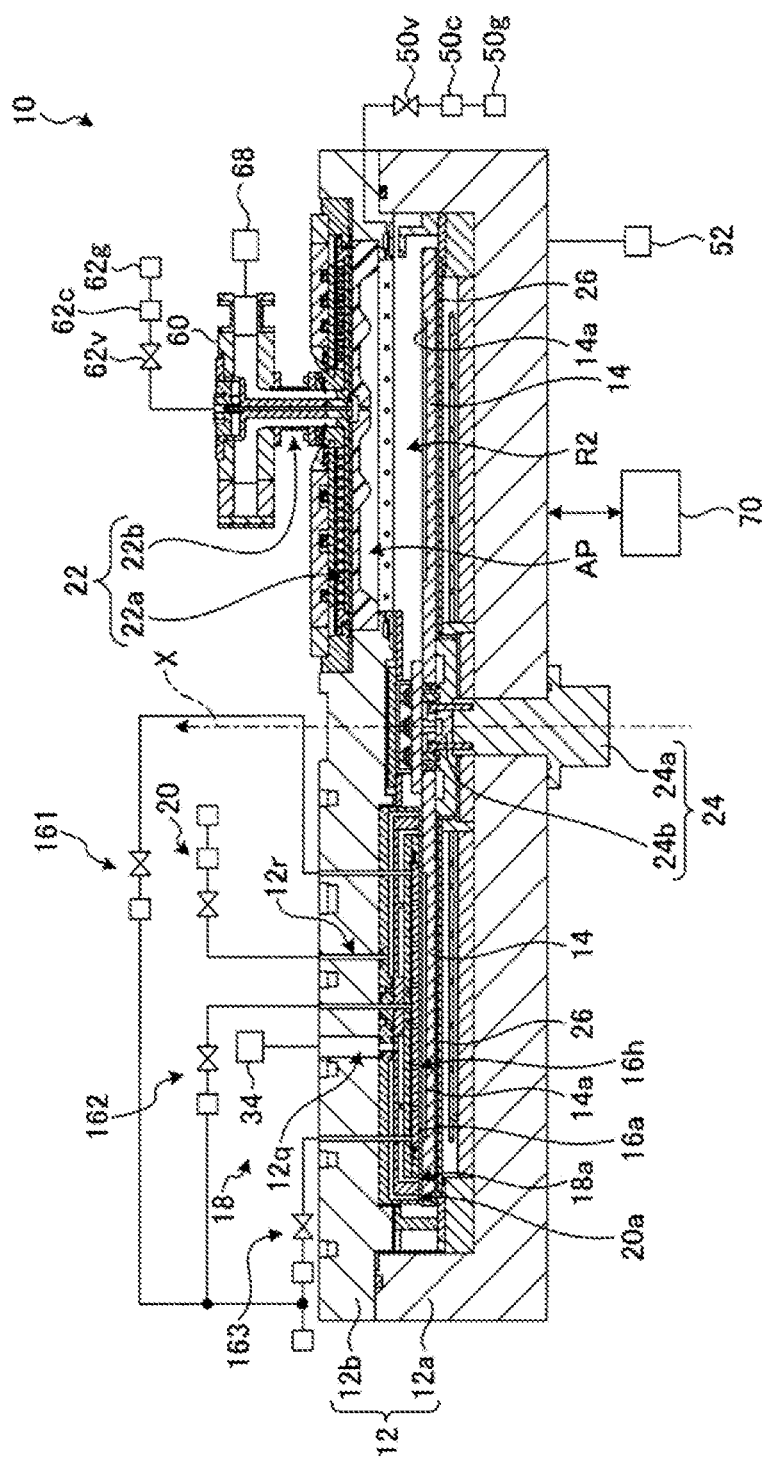
FIG. 1 is a sectional view illustrating an exemplary film forming apparatus.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the semi-batch type film forming apparatus disclosed in the document described above, the film thickness distribution from the rotation center of the mounting table on the substrate in the radial direction of the mounting table has a lower uniformity than the film thickness distribution in the rotation direction of the mounting table. Therefore, in the semi-batch type film forming apparatus, what is requested is to improve the uniformity of the film thickness from the rotation center of the mounting table on the substrate in the radial direction of the mounting table.

According to an aspect of the present disclosure, a film forming apparatus includes a mounting table, a shower head, and a flow rate controller. The mounting table is configured to place a substrate to be processed ("substrate") thereon; and provided to be rotatable around an axis such that the substrate is moved around the axis. The shower head is provided in one region among a plurality of regions, through which the substrate sequentially passes while moving in a circumferential direction around the axis due to rotation of the mounting table, such that a bottom surface of the shower head faces the mounting table, and includes at least a first buffer space and a second buffer space therein. The flow rate controller is configured to independently control a flow rate of a process gas to be supplied to each of the first buffer space and the second buffer space. In the bottom surface, the shower head further includes: a plurality of first injection ports communicated with the first buffer space and configured to downwardly inject the process gas supplied to the first buffer space; and a plurality of second injection ports communicated with the second buffer space and configured to downwardly inject the process gas supplied to the second buffer space. All the first injection ports are provided at a location closer to the axis, as compared to the second injection ports.

In the film forming apparatus, each of the first injection ports and each of the second injection ports are provided at locations, of which the distances from the axis in the bottom surface of the shower head are different from each other by a diameter of each of the first injection ports or each of the second injection ports.

In the film forming apparatus, in the bottom surface of the shower head, a distance between each adjacent first injection ports or between each adjacent second injection ports is longer than a diameter of each of the first injection ports or each of the second injection ports.

In the film forming apparatus, the shower head includes a third buffer space therein. In the bottom surface of the shower head, a plurality of third injection ports communicated with the third buffer space and configured to downwardly inject the process gas supplied to the third buffer space are provided. A distance of each of the third injection ports from the axis is longer than that of each of the first injection ports and each of the second injection ports. The flow rate controller controls a flow rate of the process gas to be supplied to the first buffer space and the third buffer space to be larger than a flow rate of the process gas to be supplied to the second buffer space.

In the film forming apparatus, among the plurality of first injection ports, a first injection port closest to the axis is provided inside an inner circumference of a region through which the substrate on the mounting table passes when viewed from a direction along the axis, and among the plurality of third injection ports, a third injection port farthest from the axis is provided outside an outer circumference of a region through which the substrate on the mounting table passes when viewed from a direction along the axis.

In the film forming apparatus, an inert gas, instead of or together with the process gas, is supplied to at least any one of the first buffer space or the second buffer space, and the flow rate controller controls a flow rate of the inert gas.

In the film forming apparatus, an inert gas is supplied to at least any one of the first buffer space or the second buffer space, instead of or together with the process gas, and the flow rate controller controls a flow rate ratio of the inert gas to the process gas.

In the film forming apparatus, when viewed from a direction along the axis, a region corresponding to the first buffer space and a region corresponding to the second buffer space include regions having the same distance from the axis, respectively.

According to an aspect of the present disclosure a shower head is used in a film forming apparatus. The film forming apparatus includes: a mounting table configured to place a substrate to be processed ("substrate") thereon, and provided to be rotatable around an axis such that the substrate is moved around the axis; a shower head provided in one region among a plurality of regions, through which the substrate sequentially passes while moving in a circumferential direction around the axis due to rotation of the mounting table, such that a bottom surface of the shower head faces the mounting table, the shower head including at least a first buffer space and a second buffer space therein; and a flow rate controller configured to independently control a flow rate of a process gas to be supplied to each of the first buffer space and the second buffer space. In the bottom surface, the shower head includes: a plurality of first injection ports communicated with the first buffer space and configured to downwardly inject the process gas supplied to the first buffer space; and a plurality of second injection ports communicated with the second buffer space and configured to downwardly inject the process gas supplied to the second buffer space. All the first injection ports are provided at a location closer to the axis, as compared to the second injection ports.

According to an aspect of the present disclosure, in the film forming apparatus, the uniformity of the film thickness of the substrate may be improved in the radial direction of the mounting table from the rotation center of the mounting table.

Hereinafter, an exemplary embodiment of a film forming apparatus and a shower head according to a disclosure will be described in detail based on drawings. Also, the disclosure is not limited by the present exemplary embodiment. Respective exemplary embodiments may be properly combined with each other within a range that does not contradict the processing contents.

Exemplary Embodiment

Figure 2:
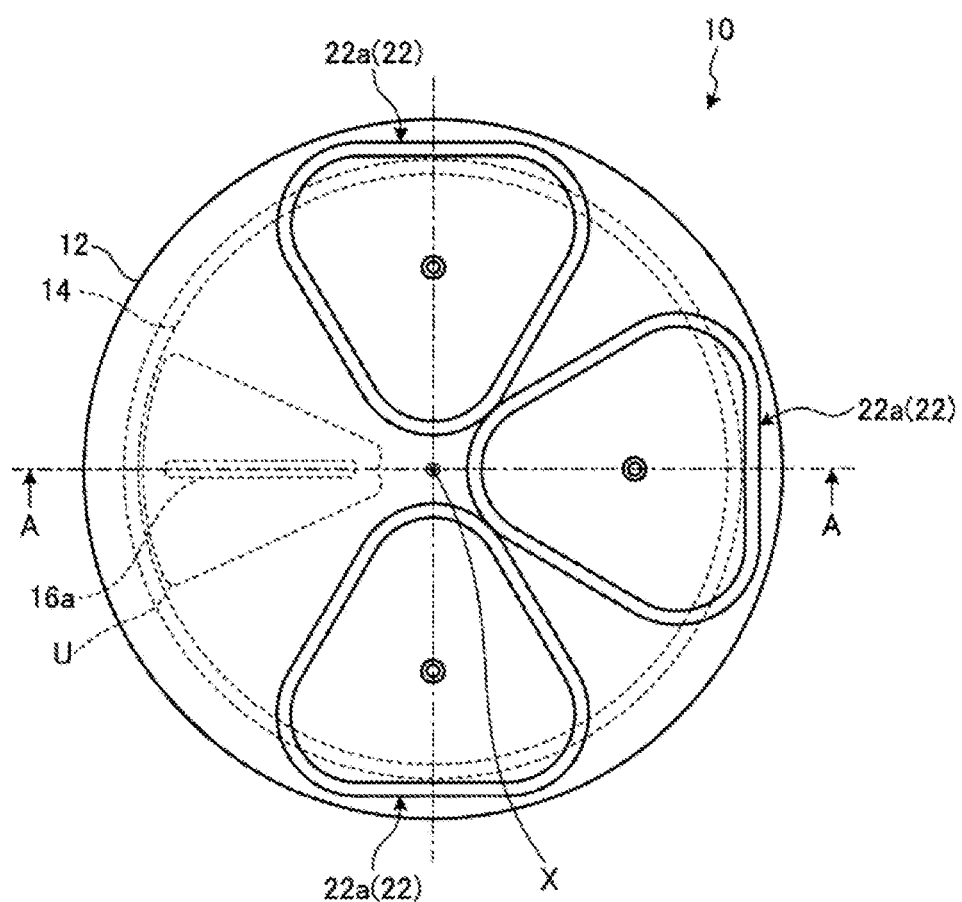
FIG. 2 is a plan view illustrating the exemplary film forming apparatus.
Figure 3:
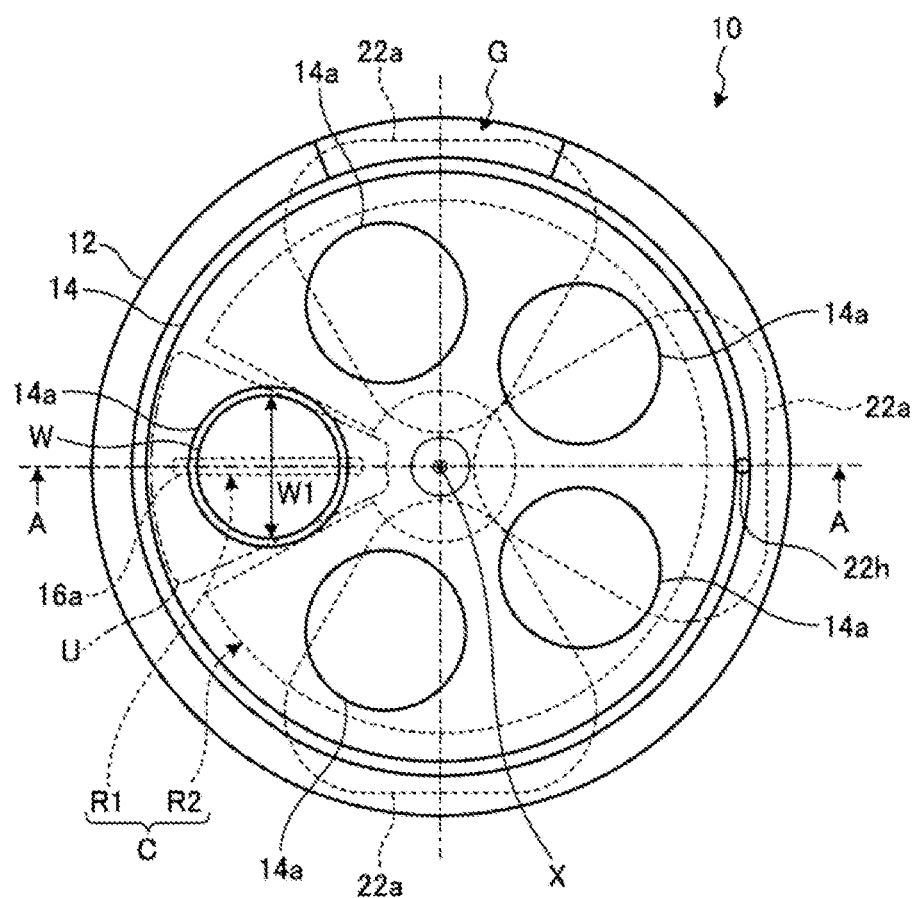
FIG. 3 is a plan view illustrating an example of a state where the top portion of a processing container is removed from the film forming apparatus illustrated in FIG. 2.
Figure 4:
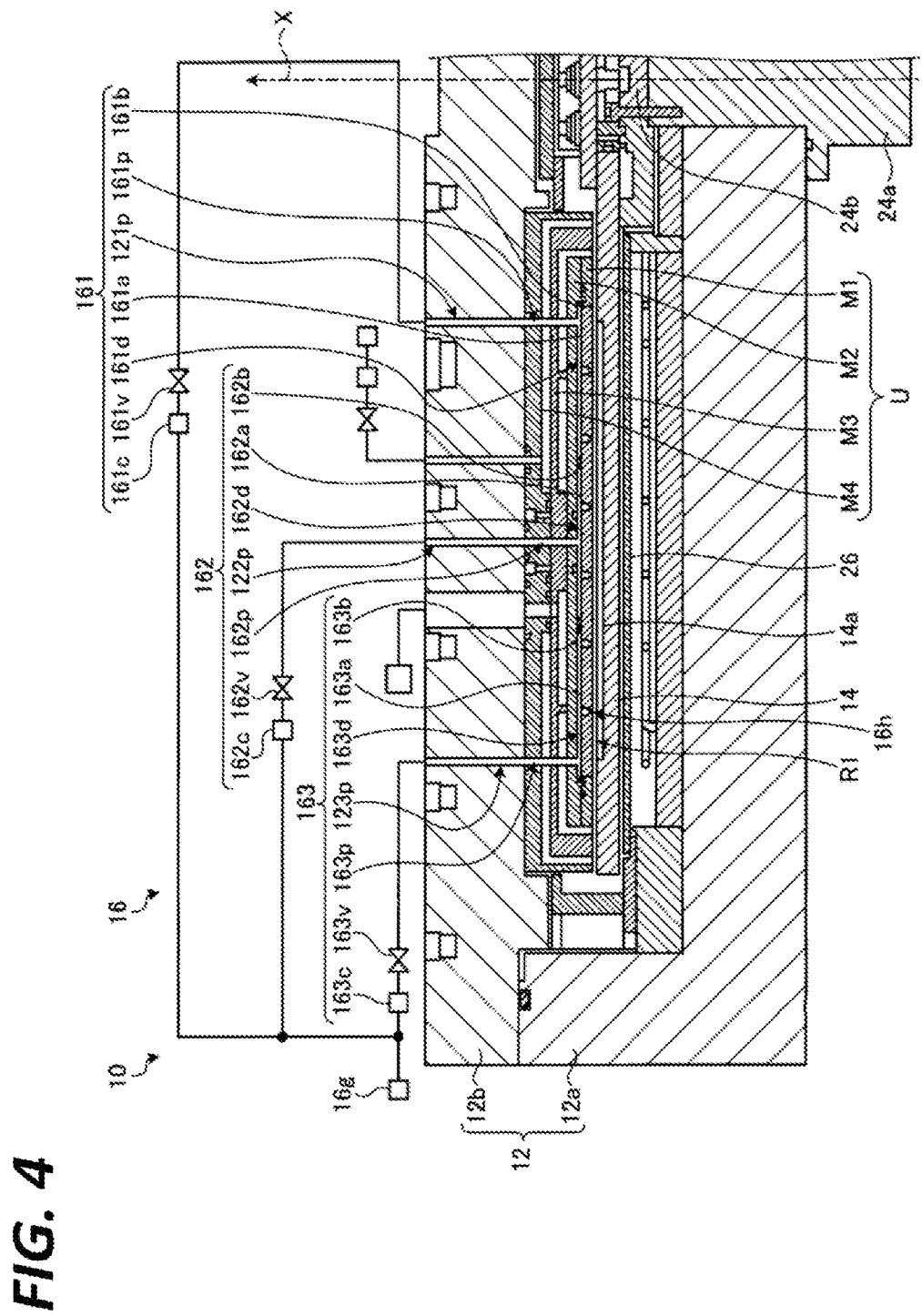
FIG. 4 is a sectional view illustrating an example of a left portion of the axis X in FIG. 1 in an enlarged scale.
Figure 5:
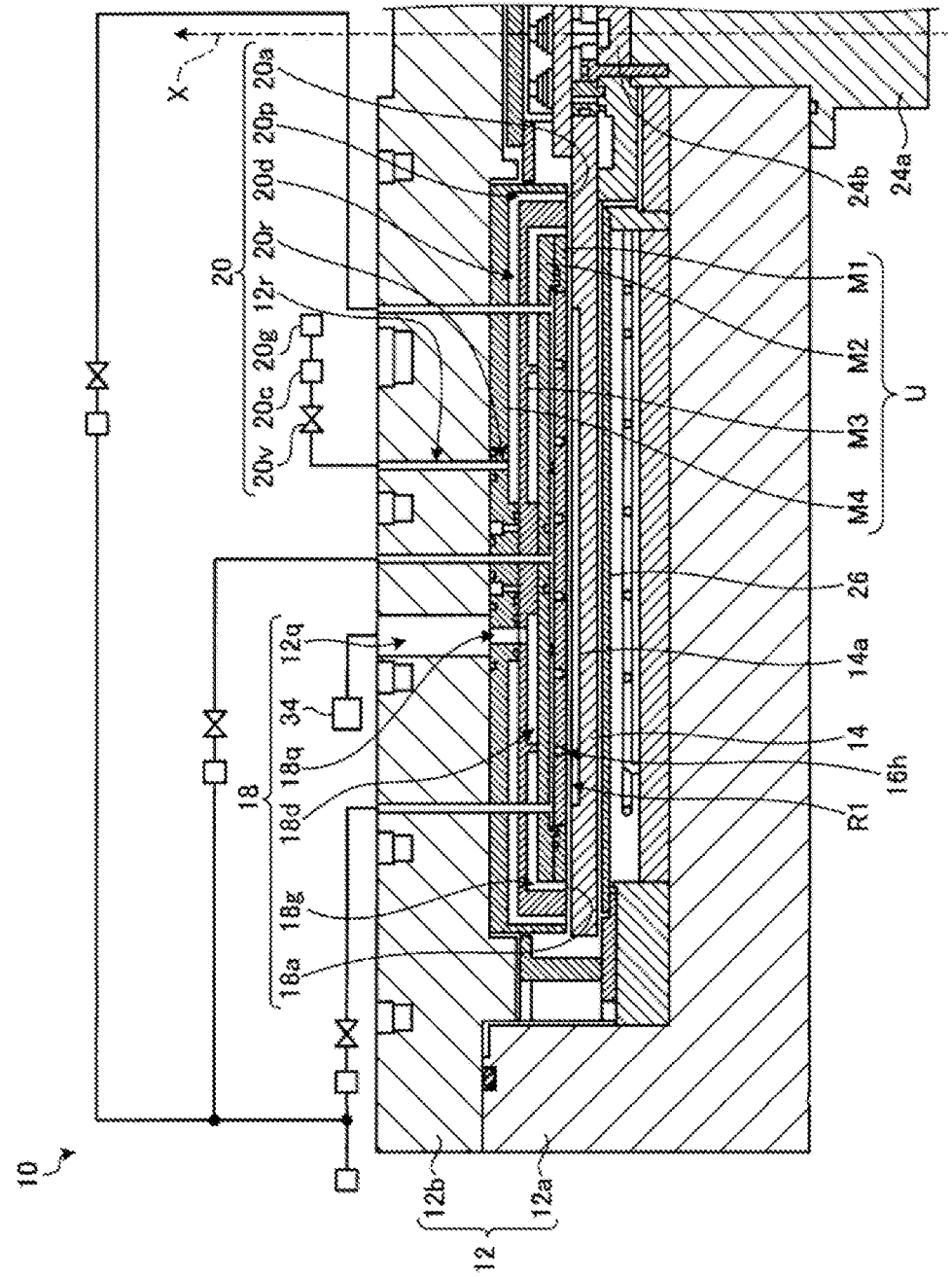
FIG. 5 is a sectional view illustrating an example of a left portion of the axis X in FIG. 1 in an enlarged scale.
Figure 6:
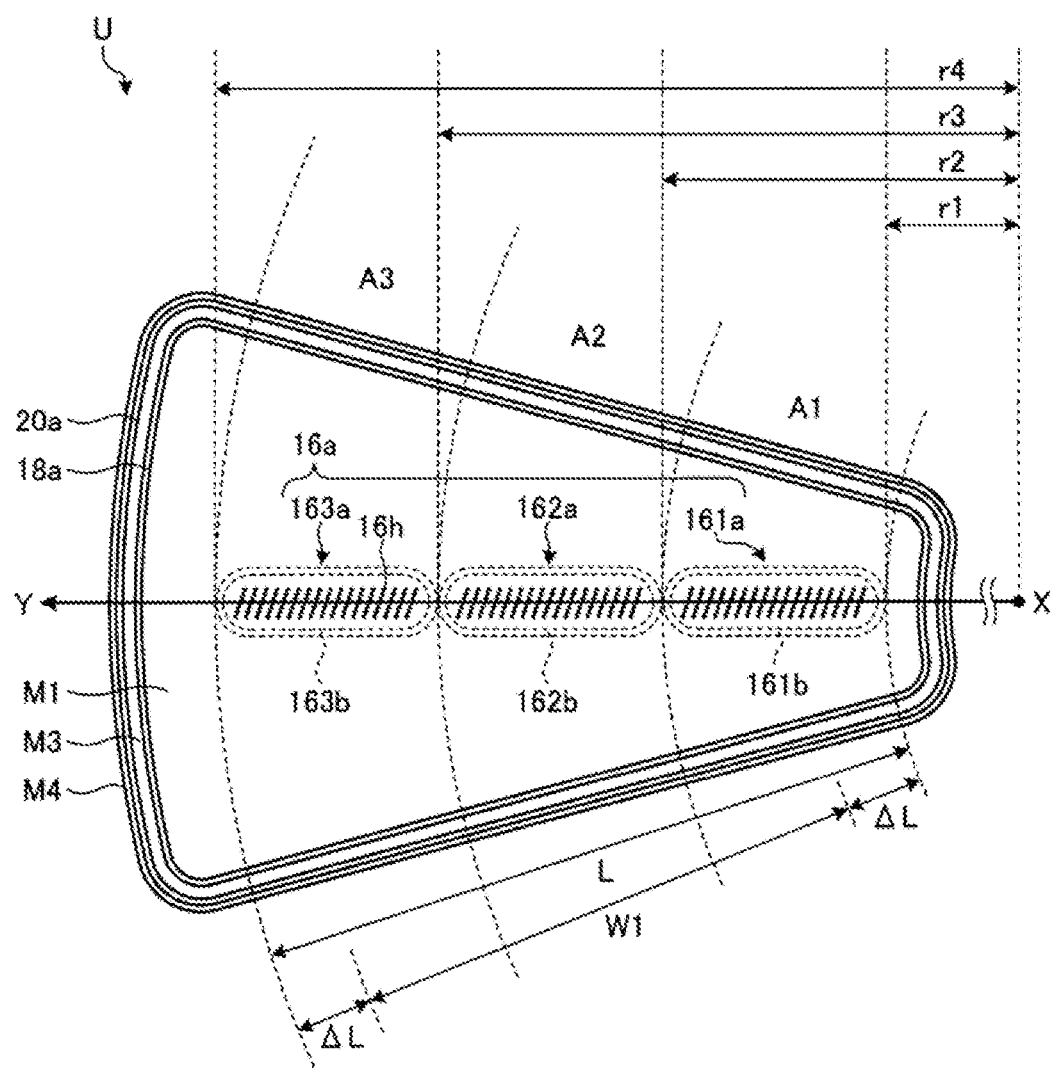
FIG. 6 is a view illustrating an example of a bottom surface of a unit U.
Figure 7:
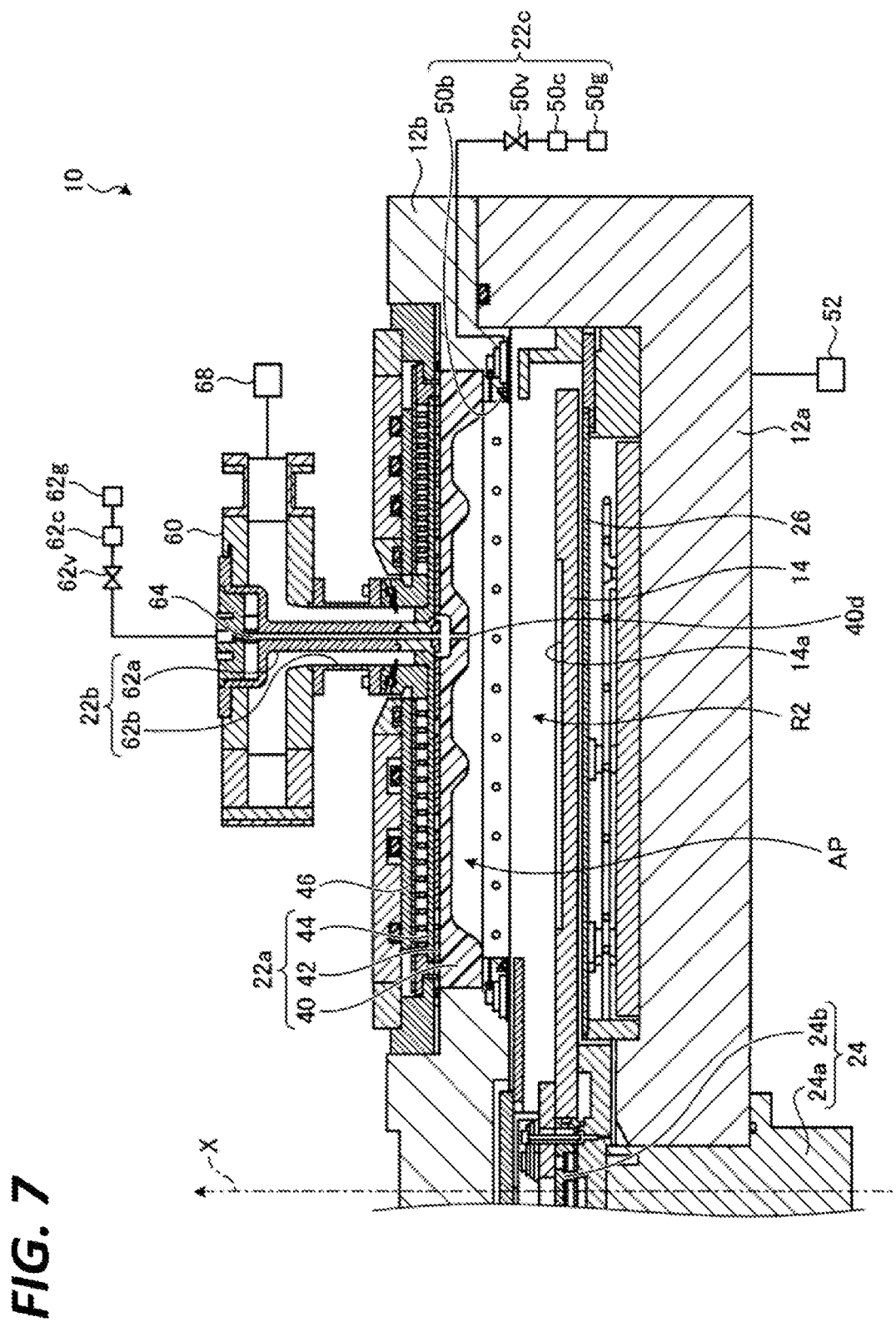
FIG. 7 is a sectional view illustrating an example of a right portion of the axis X in FIG. 1 in an enlarged scale.

FIG. 1 is a sectional view illustrating an exemplary film forming apparatus 10. FIG. 2 is a plan view illustrating the exemplary film forming apparatus 10. FIG. 3 is a plan view illustrating an example of a state where the top portion of a processing container 12 is removed from the film forming apparatus 10 illustrated in FIG. 2. In FIGS. 2 and 3, the sectional view along A-A is FIG. 1. FIGS. 4 and 5 are sectional views illustrating an example of a left portion of the axis X in FIG. 1 in an enlarged scale. FIG. 6 is a view illustrating an example of a bottom surface of a unit U. FIG. 7 is a sectional view illustrating an example of a right portion of the axis X in FIG. 1 in an enlarged scale. The film forming apparatus 10 illustrated in FIGS. 1 to 7 mainly includes the processing container 12, a mounting table 14, a first gas supply section 16, an exhaust unit 18, a second gas supply section 20, and a plasma generating unit 22.

As illustrated in FIG. 1, the processing container 12 includes a lower member 12a and an upper member 12b. The lower member 12a has a substantially cylindrical shape of which the top side is opened, and forms a concave portion including a side wall and a bottom wall which form a processing chamber C. The upper member 12b is a cover having a substantially cylindrical shape, and forms the processing chamber C by closing the upper opening of the concave portion of the lower member 12a. An elastic sealing member for sealing the processing chamber C, e.g., an O ring, is provided in the outer periphery portion between the lower member 12a and the upper member 12b.

The film forming apparatus 10 includes the mounting table 14 within the processing chamber C formed by the processing container 12. The mounting table 14 is rotationally driven around the axis X by a driving mechanism 24. The driving mechanism 24 includes a driving device 24a such as, for example, a motor, and a rotation shaft 24b, and is attached to the lower member 12a of the processing container 12.

The rotation shaft 24b extends to the inside of the processing chamber C with the axis X as a central axis. The rotation shaft 24b rotates about the axis X by a driving force transferred from the driving device 24a. The central portion of the mounting table 14 is supported by the rotation shaft 24b. Accordingly, the mounting table 14 rotates around the axis X according to the rotation of the rotation shaft 24b. An elastic sealing member such as, for example, an O ring is provided between the lower member 12a of the processing container 12 and the driving mechanism 24 to seal the processing chamber C.

The film forming apparatus 10 includes a heater 26 under the mounting table 14 within the processing chamber C in order to heat a substrate W placed on a substrate placing region 14a. Specifically, the heater 26 heats the substrate W by heating the mounting table 14.

The processing container 12, for example, as illustrated in FIGS. 2 and 3, is a substantially cylindrical container with the axis X as a central axis, and includes the processing chamber C therein. The unit U including an injection section 16a is provided in the processing chamber C. The unit U is an example of a shower head. The processing container 12 is formed of a metal such as, for example, Al (aluminum) of which the inner surface has been subjected to an anti-plasma treatment such as, for example, an alumite treatment or spraying of $Y_2O_3$ (yttrium oxide). The film forming apparatus 10 includes a plurality of plasma generating units 22 within the processing container 12. Each of the plasma generating units 22 includes an antenna 22a at the upper side of the processing container 12 to output microwaves. In FIGS. 2 and 3, three antennas 22a are provided at the upper side of the processing container 12, but the number of the antennas 22a is not limited thereto. The number may be two or less, or four or more.

The film forming apparatus 10 includes, for example, as illustrated in FIG. 3, the mounting table 14 that has a plurality of substrate placing regions 14a on the top surface thereof. The mounting table 14 is a substantially disk-shaped member with the axis X as a central axis. On the top surface of the mounting table 14, the plurality of substrate placing regions 14a (five substrate placing regions in the example of FIG. 3) each configured to place a substrate W thereon are formed concentrically around the axis X. Substrates W are disposed within the substrate placing regions 14a, respectively, and the substrate placing regions 14a support the substrates W so that when the mounting table 14 is rotated, the substrates W are not deviated therefrom. Each substrate placing region 14a is a substantially circular recessed portion having substantially the same shape as that of a substantially circular substrate W. The diameter of the recessed portion of each substrate placing region 14a is substantially the same as the diameter W1 of the substrate W placed therein. That is, the diameter of the recessed portion of each substrate placing region 14a only has to be set such that the placed substrate W is fitted in the recessed portion to be fixed without being moved from the fitted position by a centrifugal force even if the mounting table 14 is rotated.

The film forming apparatus 10 includes a gate valve G at the outer periphery of the processing container 12. The gate valve G is configured to allow the substrate W to be carried into and out of the processing chamber C therethrough using a conveyance device such as, for example, a robot arm. The film forming apparatus 10 includes an exhaust port 22h at the outer periphery of the mounting table 14. An exhaust device 52 is connected to the exhaust port 22h. The film forming apparatus 10 maintains the pressure within the processing chamber C at a target pressure by controlling the operation of the exhaust device 52.

For example, as illustrated in FIG. 3, the processing chamber C includes a first region R1 and a second region R2 arranged on the circumference around the axis X. The substrate W placed on a substrate placing region 14a sequentially passes through the first region R1 and the second region R2 while the mounting table 14 is rotated.

For example, as illustrated in FIGS. 4 and 5, the first gas supply section 16 includes an inside gas supply section 161, an intermediate gas supply section 162, and an outside gas supply section 163. Above the first region R1, the unit U configured to perform the supply and exhaust of a gas is disposed to face the top surface of the mounting table 14, for example, as illustrated in FIGS. 4 and 5. The unit U has a structure in which a first member M1, a second member M2, a third member M3, and a fourth member M4 are stacked in this order. The unit U is attached to the processing container 12 to be abutted on the bottom surface of the upper member 12b of the processing container 12.

For example, as illustrated in FIGS. 4 and 5, in the unit U, a gas supply path 161p, a gas supply path 162p, and a gas supply path 163p are formed to penetrate the second member M2 to the fourth member M4. The upper end of the gas supply path 161p is connected to a gas supply path 121p provided in the upper member 12b of the processing container 12. A gas supply source 16g of a precursor gas is connected to the gas supply path 121p through a valve 161v and a flow rate controller 161c such as, for example, a mass flow controller. The precursor gas is an example of a process gas. The lower end of the gas supply path 161p is connected to a buffer space 161d which is formed between the first member M1 and the second member M2, and surrounded by an elastic member 161b such as, for example, an O ring. The buffer space 161d is connected to injection ports 16h of an inside injection section 161a provided in the first member M1.

The upper end of the gas supply path 162p is connected to a gas supply path 122p provided in the upper member 12b of the processing container 12. The gas supply source 16g of the precursor gas is connected to the gas supply path 122p through a valve 162v and a flow rate controller 162c such as, for example, a mass flow controller. The lower end of the gas supply path 162p is connected to a buffer space 162d which is formed between the first member M1 and the second member M2, and surrounded by an elastic member 162b such as, for example, an O ring. The buffer space 162d is connected to injection ports 16h of an intermediate injection section 162a provided in the first member M1.

The upper end of the gas supply path 163p is connected to a gas supply path 123p provided in the upper member 12b of the processing container 12. The gas supply source 16g of the precursor gas is connected to the gas supply path 123p through a valve 163v and a flow rate controller 163c such as, for example, a mass flow controller. The lower end of the gas supply path 163p is connected to a buffer space 163d which is formed between the first member M1 and the second member M2, and surrounded by an elastic member 163b such as, for example, an O ring. The buffer space 163d is connected to injection ports 16h of an outside injection section 163a provided in the first member M1.

The buffer space 161d of the inside gas supply section 161, the buffer space 162d of the intermediate gas supply section 162, and the buffer space 163d of the outside gas supply section 163 form independent spaces, respectively, for example, as illustrated in FIGS. 4 and 5. Then, the flow rate of the precursor gas that passes through each buffer space is independently controlled by each of the flow rate controller 161c, the flow rate controller 162c, and the flow rate controller 163c.

In the unit U, a gas supply path 20r is formed to penetrate the fourth member M4, for example, as illustrated in FIGS. 4 and 5. The upper end of the gas supply path 20r is connected to a gas supply path 12r provided in the upper member 12b of the processing container 12. A gas supply source 20g of a purge gas is connected to the gas supply path 12r through a valve 20v and a flow rate controller 20c.

The lower end of the gas supply path 20r is connected to a space 20d provided between the bottom surface of the fourth member M4 and the top surface of the third member M3. The fourth member M4 forms a recessed portion which accommodates the first to third members M1 to M3. A gap 20p is formed between the inside surface of the fourth member M4 that forms the recessed portion, and the outside surface of the third member M3. The gap 20p is connected to the space 20d. The lower end of the gap 20p serves as an injection port 20a.

In the unit U, for example, as illustrated in FIGS. 4 and 5, an exhaust path 18q is formed to penetrate the third member M3 and the fourth member M4. The upper end of the exhaust path 18q is connected to an exhaust path 12q provided in the upper member 12b of the processing container 12. The exhaust path 12q is connected to an exhaust device 34 such as, for example, a vacuum pump. The lower end of the exhaust path 18q is connected to a space 18d provided between the bottom surface of the third member M3, and the top surface of the second member M2.

The third member M3 includes a recessed portion that accommodates the first member M1 and the second member M2. A gap 18g is formed between the outside surfaces of the first member M1 and the second member M2, and the inside surface of the third member M3 which constitutes the recessed portion provided in the third member M3. The space 18d is connected to the gap 18g. The lower end of the gap 18g serves as an exhaust port 18a.

For example, as illustrated in FIG. 6, the injection section 16a is provided along the Y axis direction that is a direction getting away from the axis X on the bottom surface of the unit U, that is, the surface facing the mounting table 14. In the region included in the processing chamber C, a region facing the injection section 16a is the first region R1. The first region R1 is an example of an adsorption processing region. The injection section 16a supplies the precursor gas to the substrate W on the mounting table 14. For example, as illustrated in FIG. 6, the injection section 16a includes the inside injection section 161a, the intermediate injection section 162a, and the outside injection section 163a.

For example, as illustrated in FIG. 6, the inside injection section 161a, is formed within an inside annular region A1 which is a region included in the bottom surface of the unit U in an annular region within a range of distances r1 to r2 from the axis X. The intermediate injection section 162a is formed within an intermediate annular region A2 which is a region included in the bottom surface of the unit U in an annular region within a range of distances r2 to r3 from the axis X. The outside injection section 163a is formed within an outside annular region A3 which is a region included in the bottom surface of the unit U in an annular region within a range of distances r3 to r4 from the axis X.

The radius r4 of the outer circumference of the outside annular region A3 is longer than the radius r3 of the outer circumference of the intermediate annular region A2. The radius r3 of the outer circumference of the intermediate annular region A2 is longer than the radius r2 of the outer circumference of the inside annular region A1. The inside annular region A1, the intermediate annular region A2, and the outside annular region A3 correspond to an example of a first annular region.

The length L from r1 to r4, which is a range in which the injection section 16a formed in the bottom surface of the unit U extends in the Y axis direction is longer than the passage length of the substrate W with the diameter W1 along the Y axis, by a predetermined distance ΔL or more in the direction toward the axis X, and is longer by a predetermined distance ΔL or more in the direction opposite to the axis X, for example, as illustrated in FIG. 6. The predetermined distance ΔL is determined according to a distance between the substrate W and the unit U in the axis X direction. In the present exemplary embodiment, the predetermined distance ΔL is, for example, several millimeters. The predetermined distance ΔL is an example of a second distance.

The inside injection section 161a, the intermediate injection section 162a, and the outside injection section 163a includes the plurality of injection ports 16h, for example, as illustrated in FIG. 6. The precursor gas is injected from each of the injection ports 16h to the first region R1. When the precursor gas is supplied to the first region R1, the atoms or molecules of the precursor gas are chemically adsorbed on the surface of the substrate W that has passed through the first region R1. The precursor gas is, for example, dichlorosilane (DCS), monochlorosilane, trichlorosilane, or hexachlorosilane.

In the present exemplary embodiment, for example, as illustrated in FIGS. 4 and 5, the elastic member 161b and the elastic member 162b are disposed between the buffer space 161d of the inside gas supply section 161 and the buffer space 162d of the intermediate gas supply section 162 so as to allow the precursor gas to be injected from the inside injection section 161a and the intermediate injection section 162a at different flow rates. Likewise, the elastic member 162b and the elastic member 163b are also disposed between the buffer space 162d of the intermediate gas supply section 162 and the buffer space 163d of the outside gas supply section 163. Therefore, in the present exemplary embodiment, in the unit U, for example, as illustrated in FIG. 6, a gap (e.g., about several millimeters) corresponding to an area where the elastic member 161b and the elastic member 162b are disposed is present in the Y axis direction between the injection ports 16h included in the inside injection section 161a, and the injection ports 16h included in the intermediate injection section 162a. Likewise, a gap (e.g., about several millimeters) corresponding to an area where the elastic member 162b and the elastic member 163b are disposed is present in the Y axis direction between the injection ports 16h included in the intermediate injection section 162a and the injection ports 16h included in the outside injection section 163a.

At the upper side of the first region R1, for example, as illustrated in FIGS. 4 and 5, the exhaust port 18a of the exhaust unit 18 is provided to face the top surface of the mounting table 14. The exhaust port 18a, for example, as illustrated in FIG. 6, is formed in the bottom surface of the unit U to surround the periphery of the injection section 16a. The exhaust port 18a exhausts a gas within the processing chamber C therethrough by the operation of the exhaust device 34 such as, for example, a vacuum pump.

At the upper side of the first region R1, for example, as illustrated in FIGS. 4 and 5, the injection port 20a of the second gas supply section 20 is provided to face the top surface of the mounting table 14. For example, as illustrated in FIG. 6, the injection port 20a is formed in the bottom surface of the unit U to surround the periphery of the exhaust port 18a. The second gas supply section 20 injects a purge gas to the first region R1 through the injection port 20a. The purge gas injected by the second gas supply section 20 is an inert gas such as, for example, Ar (argon). When the purge gas is injected to the surface of the substrate W, the atoms or molecules (a residual gas component) of the precursor gas, which have been excessively chemically adsorbed to the substrate W, are removed from the substrate W. Accordingly, on the surface of the substrate W, an atomic layer or a molecular layer is formed in which the atoms or molecules of the precursor gas are chemically adsorbed.

The unit U injects the purge gas from the injection port 20a, and exhausts the purge gas from the exhaust port 18a along the surface of the mounting table 14. Accordingly, the unit U suppresses the precursor gas supplied to the first region R1 from being leaked to the outside of the first region R1. Since the unit U injects the purge gas from the injection port 20a to exhaust the purge gas along the surface of the mounting table 14 from the exhaust port 18a, for example, a reaction gas supplied to the second region R2 or the radicals of the reaction gas may be suppressed from infiltrating into the inside of the first region R1. That is, the unit U separates the first region R1 and the second region R2 from each other through the injection of the purge gas from the second gas supply section 20 and the exhaust from the exhaust unit 18.

The film forming apparatus 10, for example, as illustrated in FIG. 7, includes the plasma generating unit 22 at an aperture AP of the upper member 12b at the upper side of the second region R2 that is provided to face the top surface of the mounting table 14. The plasma generating unit 22 includes the antenna 22a, and a coaxial waveguide 22b configured to supply microwaves and a reaction gas to the antenna 22a. For example, three apertures AP are formed in the upper member 12b, and the film forming apparatus 10 includes, for example, three plasma generating units 22.

The plasma generating unit 22 supplies a reaction gas and microwaves to the second region R2, and generates plasma of the reaction gas in the second region R2. Then, the plasma generating unit 22 performs a plasma processing on an atomic layer or a molecular layer chemically adsorbed on the substrate W. When a nitrogen-containing gas is used as the reaction gas, the atomic layer or molecular layer chemically adsorbed onto the substrate W is nitrated by the plasma generating unit 22. As for the reaction gas, a nitrogen-containing gas such as, for example, $N_2$ (nitrogen) or $NH_3$ (ammonia), may be used.

In the plasma generating unit 22, for example, as illustrated in FIG. 7, the antenna 22a is airtightly disposed to close the aperture AP. The antenna 22a includes a top plate 40, a slot plate 42, and a slow wave plate 44. The top plate 40 is a substantially equilateral triangular member that is formed of a dielectric material, such as, for example, an alumina ceramic. The top plate 40 is supported by the upper member 12b such that the bottom surface of the top plate 40 is exposed to the second region R2 from the aperture AP formed in the upper member 12b of the processing container 12. An injection port 40d is formed in the bottom surface of the top plate 40 to penetrate the top plate 40 in the thickness direction.

The slot plate 42 is disposed on the top surface of the top plate 40. The slot plate 42 is a plate-like metal member formed in a substantially equilateral triangular shape. An opening is formed in the slot plate 42 at a location overlapping the injection port 40d of the top plate 40 in the axis X direction. A plurality of slot pairs are formed in the slot plate 42. Each slot pair includes two perpendicular or crossing slot holes.

The slow wave plate 44 is provided on the top surface of the slot plate 42. The slow wave plate 44 is a substantially equilateral triangular member that is formed of a dielectric material such as, for example, an alumina ceramic. A substantially cylindrical opening is formed in the slow wave plate 44 such that an outer conductor 62b of the coaxial waveguide 22b is arranged in the opening.

A metallic cooling plate 46 is provided on the top surface of the slow wave plate 44. The cooling plate 46 cools the antenna 22a through the slow wave plate 44 by a coolant that flows through a flow path formed in the cooling plate 46. The cooling plate 46 is pressed against the top surface of the slow wave plate 44 by, for example, a spring (not illustrated), and the bottom surface of the cooling plate 46 is in close contact with the top surface of the slow wave plate 44.

The coaxial waveguide 22b includes a substantially cylindrical hollow inner conductor 62a and the outer conductor 62b. The inner conductor 62a extends through the opening of the slow wave plate 44 and the opening of the slot plate 42 from the top side of the antenna 22a. A space 64 within the inner conductor 62a is communicated with the injection port 40d of the top plate 40. A gas supply source 62g of a reaction gas is connected to the upper end of the inner conductor 62a through a valve 62v and a flow rate controller 62c such as, for example, a mass flow controller. The reaction gas supplied from the valve 62v to the coaxial waveguide 22b is injected to the second region R2 from the injection port 40d of the top plate 40 through the space 64 within the inner conductor 62a.

The outer conductor 62b is provided to surround the inner conductor 62a with a gap being formed between the outer peripheral surface of the inner conductor 62a and the inner peripheral surface of the outer conductor 62b. The lower end of the outer conductor 62b is connected to an opening portion of the cooling plate 46.

The film forming apparatus 10 includes a waveguide 60 and a microwave generator 68. The microwaves of, for example, about 2.45 GHz generated by the microwave generator 68 is propagated to the coaxial waveguide 22b through the waveguide 60, and is propagated through the gap between the inner conductor 62a and the outer conductor 62b. Then, the microwaves propagated within the slow wave plate 44 are propagated from the slot holes of the slot plate 42 to the top plate 40, and radiated from the top plate 40 to the second region R2.

The reaction gas is also supplied from a reaction gas supply section 22c to the second region R2. The reaction gas supply section 22c includes an injection section 50b. The plurality of injection sections 50b are provided inside the upper member 12b of the processing container 12 to extend around, for example, the apertures AP. The injection section 50b injects a reaction gas supplied from a gas supply source 50g toward the second region R2 below the top plate 40. The injection section 50b is connected to the gas supply source 50g of the reaction gas through a valve 50v and a flow rate controller 50c such as, for example, a mass flow controller.

The plasma generating unit 22 supplies the reaction gas to the second region R2 by the injection port 40d of the top plate 40 and the injection section 50b of the reaction gas supply section 22c, and radiates microwaves to the second region R2 by the antenna 22a. Accordingly, the plasma generating unit 22 generates plasma of the reaction gas in the second region R2.

For example, as illustrated in FIG. 1, the film forming apparatus 10 includes a controller 70 configured to control respective elements of the film forming apparatus 10. The controller 70 may be a computer including, for example, a control device such as, for example, a central processing unit (CPU), a storage device such as, for example, a memory, and an input/output device. When the CPU is operated according to a control program stored in the memory, the controller 70 controls the respective elements of the film forming apparatus 10.

The controller 70 transmits a control signal for controlling the rotation speed of the mounting table 14 to the driving device 24a. The controller 70 transmits a control signal for controlling the temperature of the substrate W to a power supply unit connected to the heater 26. The controller 70 transmits a control signal for controlling the flow rate of the precursor gas to the valves 161v to 163v and the flow rate controllers 161c to 163c. The controller 70 transmits a control signal for controlling the exhaust volume of the exhaust device 34 connected to the exhaust port 18a, to the exhaust device 34.

The controller 70 transmits a control signal for controlling the flow rate of the purge gas to the valve 20v and the flow rate controller 20c. The controller 70 transmits a control signal for controlling the transmission power of microwaves to the microwave generator 68. The controller 70 transmits a control signal for controlling the flow rate of the reaction gas to the valve 50v, the valve 62v, the flow rate controller 50c, and the flow rate controller 62c. The controller 70 transmits a control signal for controlling the exhaust volume from the exhaust port 22h to the exhaust device 52.

By the film forming apparatus 10 configured as described above, the precursor gas is injected from the first gas supply section 16 onto the substrate W, and the excessively chemically adsorbed precursor gas is removed from the substrate W by the second gas supply section 20. Then, the substrate W is exposed to the plasma of the reaction gas generated by the plasma generating unit 22. The film forming apparatus 10 repeats the operations described above on the substrate W so as to form a film with a predetermined thickness on the substrate W.

Here, in the unit U of the present exemplary embodiment, the injection section 16a of the first gas supply section 16 configured to supply a precursor gas is provided. The injection section 16a includes the inside injection section 161a, the intermediate injection section 162a, and the outside injection section 163a. The first gas supply section 16 independently controls a flow rate of the precursor gas injected from each of the inside injection section 161a, the intermediate injection section 162a, and the outside injection section 163a.

FIGS. 8 to 12 are views illustrating examples of a film thickness distribution when the flow rates of a precursor gas injected from the inside injection section 161a, the intermediate injection section 162a, and the outside injection section 163a were changed, respectively. In FIGS. 8 to 12, the experiments were performed by fixing the total of flow rates of the precursor gas injected from the inside injection section 161a, the intermediate injection section 162a, and the outside injection section 163a as 400 sccm. In FIGS. 8 to 12, "0" on the horizontal axis indicates the central position of the substrate W.

Figure 8:
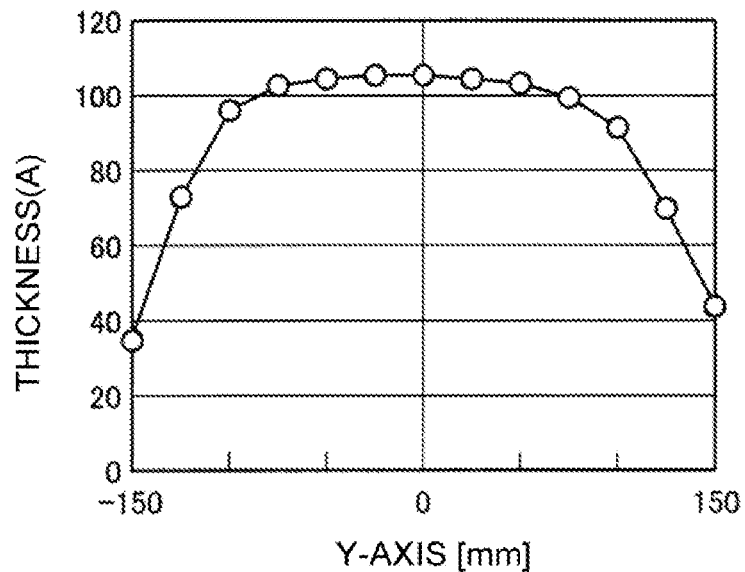
FIG. 8 is a view illustrating an example of a film thickness distribution when flow rates of a precursor gas injected from an inside injection section, an intermediate injection section, and an outside injection section were changed, respectively.
Figure 9:
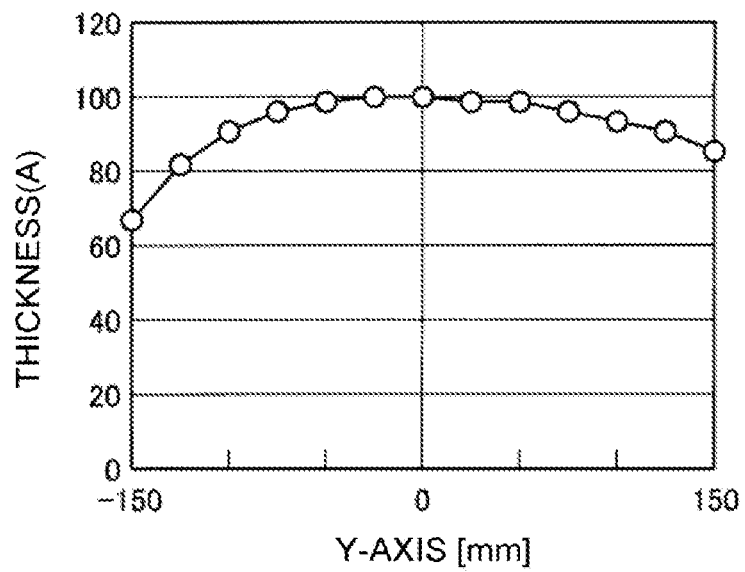
FIG. 9 is a view illustrating an example of a film thickness distribution when flow rates of a precursor gas injected from an inside injection section, an intermediate injection section, and an outside injection section were changed, respectively.
Figure 10:
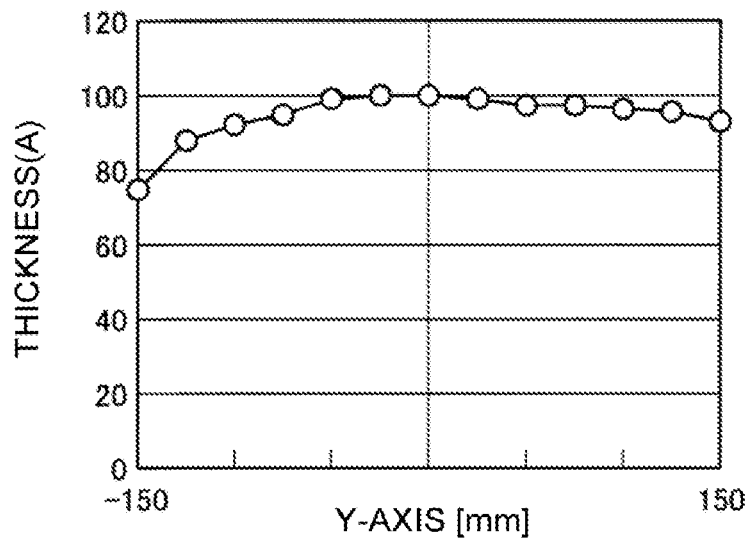
FIG. 10 is a view illustrating an example of a film thickness distribution when flow rates of a precursor gas injected from an inside injection section, an intermediate injection section, and an outside injection section were changed, respectively.
Figure 11:
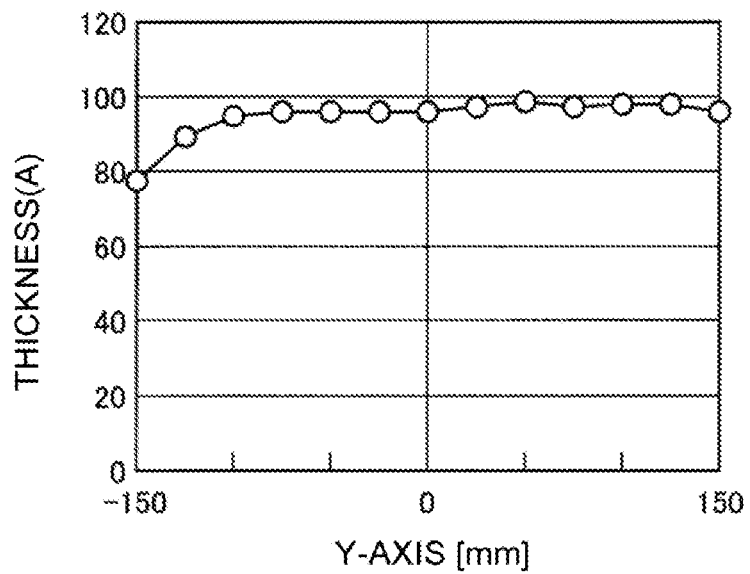
FIG. 11 is a view illustrating an example of a film thickness distribution when flow rates of a precursor gas injected from an inside injection section, an intermediate injection section, and an outside injection section were changed, respectively.
Figure 12:
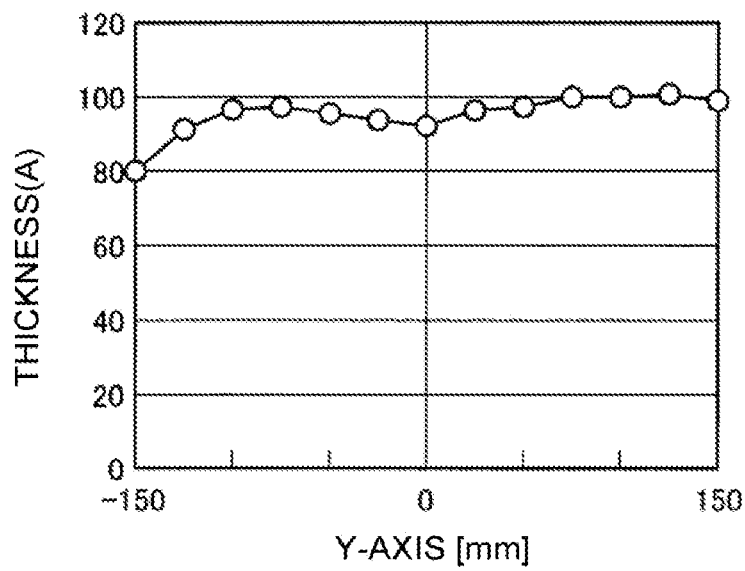
FIG. 12 is a view illustrating an example of a film thickness distribution when flow rates of a precursor gas injected from an inside injection section, an intermediate injection section, and an outside injection section were changed, respectively.

FIG. 8 illustrates an example of a film thickness distribution when the flow rates of the precursor gas injected from the inside injection section 161a, the intermediate injection section 162a, and the outside injection section 163a were set as 0 sccm, 400 sccm, and 0 sccm, respectively. FIG. 9 illustrates an example of a film thickness distribution when the flow rates of the precursor gas injected from the inside injection section 161a, the intermediate injection section 162a, and the outside injection section 163a were set as 78 sccm, 244 sccm, and 78 sccm, respectively. FIG. 10 illustrates an example of a film thickness distribution when the flow rates of the precursor gas injected from the inside injection section 161a, the intermediate injection section 162a, and the outside injection section 163a were set as 133 sccm, 133 sccm, and 133 sccm, respectively. FIG. 11 illustrates an example of a film thickness distribution when the flow rates of the precursor gas injected from the inside injection section 161a, the intermediate injection section 162a, and the outside injection section 163a were set as 173 sccm, 54 sccm, and 173 sccm, respectively. FIG. 12 illustrates an example of a film thickness distribution when the flow rates of the precursor gas injected from the inside injection section 161a, the intermediate injection section 162a, and the outside injection section 163a were set as 200 sccm, 0 sccm, and 200 sccm, respectively.

As found from FIGS. 8 to 12, when the flow rates of the precursor gas injected from the inside injection section 161a and the outside injection section 163a are increased, the film thickness in the vicinity of the edge of the substrate W is increased. Also, when the flow rate of the precursor gas injected the intermediate injection section 162a is decreased, the precursor gas injected from the inside injection section 161a and the outside injection section 163a is diffused to the center of the substrate W. Thus, the film thickness around the center of the substrate W is not decreased that much. Then, when the flow rates of the precursor gas injected from the inside injection section 161a and the outside injection section 163a are set to be relatively higher than the flow rate of the precursor gas injected from the intermediate injection section 162a, the uniformity of the film thickness in the Y axis direction is increased.

In the vicinity of the edge of the substrate W in the Y axis direction, the film thickness is changed according to the flow rates of the precursor gas injected from the inside injection section 161a and the outside injection section 163a. Accordingly, in the vicinity of the edge of the substrate W in the Y axis direction, the film thickness may be controlled by controlling the flow rates of the precursor gas injected from the inside injection section 161a and the outside injection section 163a.

However, around the center of the substrate W in the Y axis direction, even when the flow rate of the precursor gas injected from the intermediate injection section 162a is decreased, the film thickness is not decreased too much due to the diffusion of the precursor gas injected from the inside injection section 161a and the outside injection section 163a. Therefore, around the center of the substrate W, it is difficult to control the film thickness only by controlling the flow rate of the precursor gas injected from the intermediate injection section 162a. Therefore, around the center of the substrate W in the Y axis direction, a control for decreasing the film thickness is performed by injecting an inert gas from the intermediate injection section 162a. In the present exemplary embodiment, the inert gas is, for example, an Ar (argon) gas.

Figure 13:
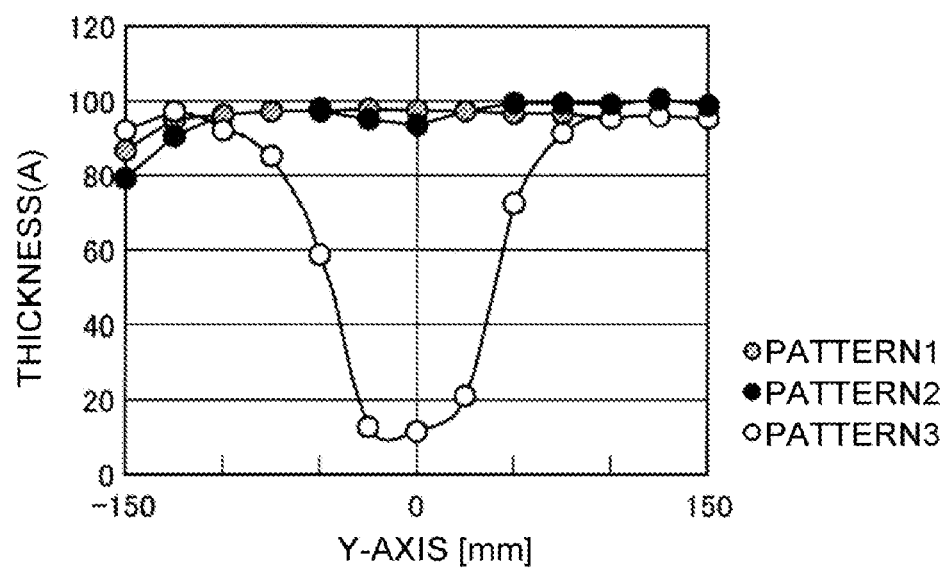
FIG. 13 is a view illustrating an example of a film thickness distribution when an inert gas was supplied from the intermediate injection section.

FIG. 13 is a view illustrating an example of a film thickness distribution when an inert gas was supplied from the intermediate injection section 162a. FIG. 13 illustrates a film thickness distribution on the substrate W in the Y axis direction when a gas was injected in three patterns from the inside injection section 161a, the intermediate injection section 162a, and the outside injection section 163a. In pattern 1, a precursor gas is injected at 233 sccm from each of the inside injection section 161a, the intermediate injection section 162a, and the outside injection section 163a. In pattern 2, a precursor gas is injected at 233 sccm from each of the inside injection section 161a and the outside injection section 163a, and the precursor gas is not injected from the intermediate injection section 162a. In pattern 3, a precursor gas is injected at 233 sccm from each of the inside injection section 161a and the outside injection section 163a, and Ar gas is injected at 233 sccm from the intermediate injection section 162a.

As found from the film thickness distributions in patterns 1 and 2 illustrated in FIG. 13, even when the precursor gas is not injected from the intermediate injection section 162a, the film thickness is not decreased around the center of the substrate W. It is considered that this is caused because the precursor gas injected from the inside injection section 161a and the outside injection section 163a is diffused to the center side of the substrate W. Accordingly, in the control of only the precursor gas, it is difficult to reduce the film thickness around the center of the substrate W. In contrast, in pattern 3 in which the inert gas is injected from the intermediate gas supply section 162, the film thickness around the center of the substrate W may be decreased. It is considered that this is caused because the precursor gas is suppressed from being adsorbed on the substrate W around the center of the substrate W due to the inert gas injected from the intermediate injection section 162a.

Figure 14:
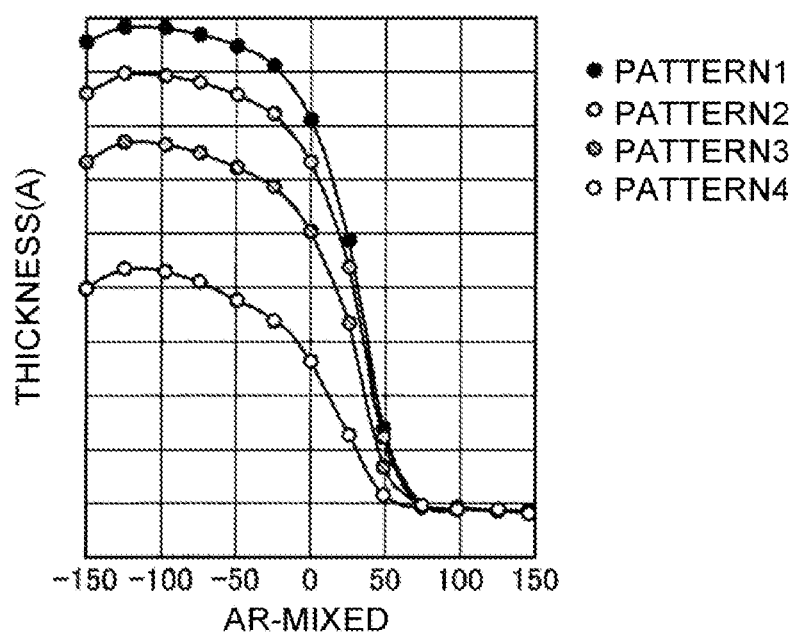
FIG. 14 is a view illustrating an example of a change in a film thickness when a ratio of an inert gas was changed.

FIG. 14 is a view illustrating an example of a change in a film thickness when a ratio of an inert gas was changed. In FIG. 14, the total of the flow rates of a precursor gas and an inert gas is set as 297 sccm. In FIG. 14, the experiment was performed using only the outside injection section 163a in the vicinity of the edge of the substrate W at the opposite side to the axis X side. Pattern 1 is a flow rate pattern with the precursor gas of 100%. Pattern 2 is a flow rate pattern with the precursor gas of 75%, and the inert gas of 25%. Pattern 3 is a flow rate pattern with the precursor gas of 50%, and the inert gas of 50%. Pattern 4 is a flow rate pattern with the precursor gas of 25%, and the inert gas of 75%.

As found from FIG. 14, when the ratio of the inert gas flow rate to the precursor gas flow rate is decreased, the film thickness is increased, and when the ratio of the inert gas flow rate to the precursor gas flow rate is increased, the film thickness is decreased. As described above, the film thickness may be controlled by controlling the ratio of the flow rate of the inert gas to the flow rate of the precursor gas.

Up to now, the uniformity and controllability of the film thickness distribution were examined From here, a minimum value of a flow rate of the precursor gas will be examined which may cause the elements of the precursor gas to be sufficiently adsorbed on the substrate W. In the present exemplary embodiment, in the bottom surface of the unit U, a gap of about several millimeters is present in the Y axis direction between the inside injection section 161a and the intermediate injection section 162a, and the intermediate injection section 162a and the outside injection section 163a, for example, as illustrated in FIG. 6. The precursor gas injected from each of the inside injection section 161a, the intermediate injection section 162a, and the outside injection section 163a is diffused through the gap between the inside injection section 161a and the intermediate injection section 162a, and the gap between the intermediate injection section 162a and the outside injection section 163a. In the following experiment, in order to take the influence of the gap into consideration, the equation of Langmuir as indicated below was used.

$$\text{Thickness}(Q_{dcs}) = \frac{(S - T_{min}) \times f(x)}{1 - f(x)} + T_{min} \quad \text{[Equation 1]}$$

$$f(x) = A \times Q_{out} \text{ or } f(x) = A \times Q_{in}$$

In the equation above, $Q_{out}$ represents a flow rate of a precursor gas injected from the outside injection section 163a of the outside gas supply section 163, and $Q_{in}$ represents a flow rate of a precursor gas injected from the inside injection section 161a of the inside gas supply section 161. As for the values of a saturated film thickness S, a minimum film thickness $T_{min}$, and a coefficient A, the values shown in Table 1 below were used.

TABLE 1

Parameter of Equation of Langmuir

|  |  | Inside | Outside |
|---|---|---|---|
| Saturated Film Thickness | S | 108.67 | |
| Minimum Film Thickness | $T_{min}$ | 9.8594 | |
| Coefficient | A | 0.0133 | 0.035 |

Figure 15:
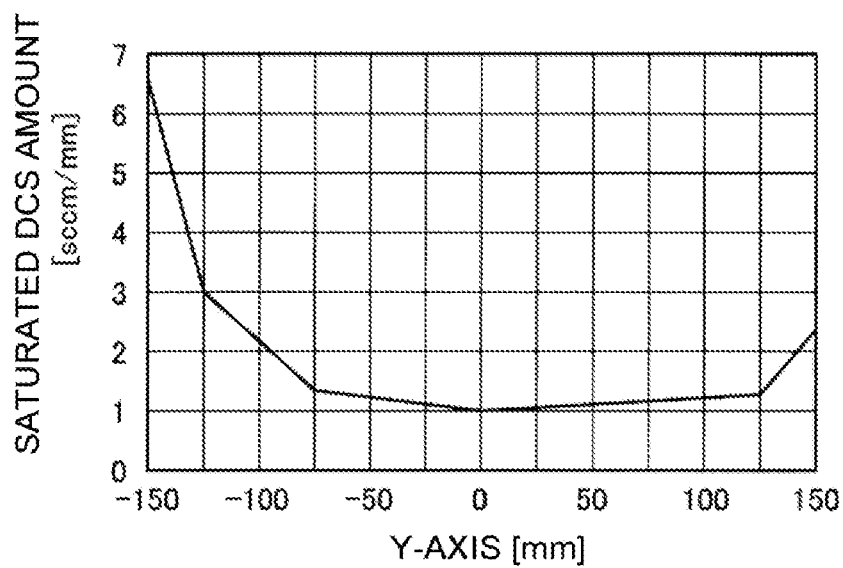
FIG. 15 is a view illustrating an example of a flow rate of a precursor gas that saturates an adsorption amount.

In the Y axis direction on the substrate W, the calculation result of the flow rate of the precursor gas that saturates the adsorption amount of the elements of the precursor gas becomes as represented in FIG. 15, for example. As illustrated in FIG. 15, in order to saturate the adsorption amount of the elements of the precursor gas in the vicinity of the edge of the substrate W in the Y axis direction, it is necessary to increase the flow rate of the precursor gas in the vicinity of the edge of the substrate W to be larger than that in the vicinity of the center of the substrate W. Also, in order to saturate the adsorption amount of the elements of the precursor gas in the vicinity of the edge of the substrate W at the outer periphery side of the mounting table 14, it is necessary to increase the flow rate of the precursor gas in the vicinity of the edge of the substrate W at the outer periphery side of the mounting table 14 to be larger than that in the vicinity of the edge of the substrate W at the rotation center side of the mounting table 14.

In the experiment, the total of the flow rates of the precursor gas at respective locations on the substrate W in the Y axis direction which satisfy the flow rates of the precursor gas illustrated in FIG. 15 was calculated by changing the length of the inside injection section 161a in the Y axis direction, the length of the intermediate injection section 162a in the Y axis direction, and the length of the outside injection section 163a in the Y axis direction, respectively. In the experiment, the Y axis direction lengths of the inside injection section 161a/the intermediate injection section 162a/the outside injection section 163a were set as three types of 90 mm/90 mm/90 mm, 45 mm/170 mm/45 mm, and 35 mm/190 mm/35 mm, and then the total of the flow rates of the precursor gas which satisfy the flow rates of the precursor gas illustrated in FIG. 15 was calculated. The length of the inside injection section 161a in the Y axis direction is a length in the Y axis direction from the injection ports 16h at a location closest to the axis X to the injection ports 16h at a location farthest from the axis X among the injection ports 16h included in the inside injection section 161a. This is equally applied to the length in the Y axis direction of each of the intermediate injection section 162a and the outside injection section 163a.

Figure 16:
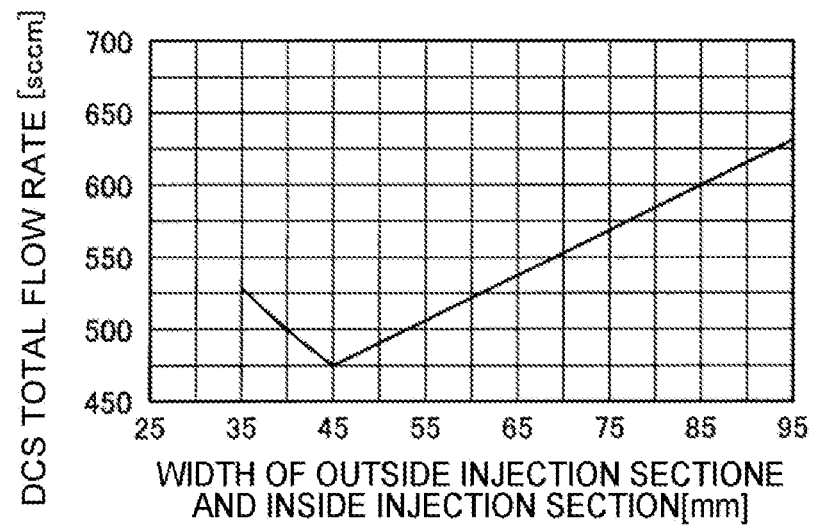
FIG. 16 is a view illustrating an example of a relationship between a total flow rate of a precursor gas which is capable of saturating an adsorption amount, and lengths of the inside injection section and the outside injection section.

FIG. 16 is a view illustrating an example of a relationship between a total flow rate of a precursor gas, which is capable of saturating the adsorption amount, and lengths of the inside injection section 161a and the outside injection section 163a. Referring to FIG. 16, it can be found that when the lengths of the inside injection section 161a, the intermediate injection section 162a, and the outside injection section 163a are changed, the total flow rate of the precursor gas, which is capable of saturating the adsorption amount, is changed. Referring to FIG. 16, it can be found that when the lengths of the inside injection section 161a, the intermediate injection section 162a, and the outside injection section 163a are changed, there exists a minimum value of the total flow rate of the precursor gas, which is capable of saturating the adsorption amount. In the experiment, when the lengths of the inside injection section 161a and the outside injection section 163a in the Y axis direction were 45 mm, respectively, the total flow rate of the precursor gas, which is capable of saturating the adsorption amount, was minimized. In this case, the length of the intermediate injection section 162a in the Y axis direction was 170 mm.

Figure 17:
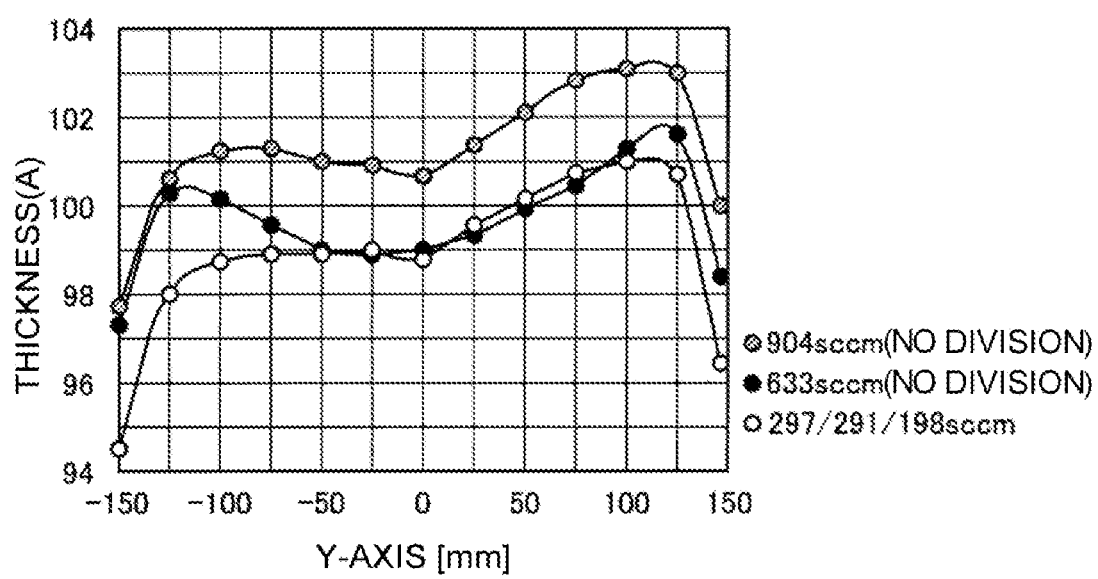
FIG. 17 is a view illustrating an example of a film thickness distribution on the substrate W in the Y axis direction.

When the lengths of the inside injection section 161a/the intermediate injection section 162a/the outside injection section 163a in the Y axis direction were 45 mm/170 mm/45 mm, respectively, the flow rates of the precursor gas injected from the injection sections were 297 sccm/291 sccm/198 sccm, respectively. In this case, the distribution of the film thickness on the substrate W in the Y axis direction was the same as that illustrated in, for example, FIG. 17. FIG. 17 is a view illustrating an example of a film thickness distribution on the substrate W in the Y axis direction.

FIG. 17 illustrates a film thickness distribution in a case where the unit U in which an injection section 16a is not divided in the Y axis direction is used, for comparison. In the unit U in which the injection section 16a is not divided in the Y axis direction, the precursor gas injected from the injection section 16a is injected at the same flow rate in the Y axis direction. As illustrated in FIG. 17, in the unit U in which the injection section 16a is not divided, when the total flow rate of the precursor gas injected from the injection section 16a is set as 904 sccm, the film thicknesses at respective locations on the substrate W in the Y axis direction are generally shifted in a direction where the film thicknesses are increased, as compared to the case where the total flow rate of the precursor gas injected from the injection section 16a is 633 sccm. However, there is only a small change in the film thickness distribution between the case where the total flow rate of the precursor gas injected from the injection section 16a is 904 sccm and the case where the total flow rate of the precursor gas injected from the injection section 16a is 633 sccm. When the total flow rate of the precursor gas injected from the injection section 16a is 633 sccm, the difference between the maximum value and the minimum value of the film thickness distribution was about 6.5. When the total flow rate of the precursor gas injected from the injection section 16a is 904 sccm, the difference between the maximum value and the minimum value of the film thickness distribution was about 5.5.

Meanwhile, when the precursor gas was injected from the inside injection section 161a/the intermediate injection section 162a/the outside injection section 163a at flow rates of 297 sccm/291 sccm/198 sccm, respectively, the difference between the maximum value and the minimum value of the film thickness distribution is about 4.5. In this case, the uniformity in the film thickness distribution is higher than those in any other cases described above. Also, the total flow rate of the precursor gas in this case is 786 sccm, and thus, the flow rate of the precursor gas is smaller than 904 sccm in the case where the injection section 16a is not divided. In this manner, when the lengths of the inside injection section 161a/the intermediate injection section 162a/the outside injection section 163a are 45 mm/170 mm/45 mm, respectively, the uniformity of the film thickness distribution on the substrate W in the Y axis direction may be improved, and the total flow rate of the precursor gas may be reduced.

Figure 18:
FIG. 18 is a schematic view illustrating an example of an arrangement of injection ports.

Here, the injection ports 16h, which are included in the inside injection section 161a, the intermediate injection section 162a, and the outside injection section 163a, may be ideally arranged to be aligned with no gap on a straight line in the Y axis direction in the bottom surface of the unit U, for example, as illustrated in FIG. 18. According to this, when the substrate W has passed through the underside of the injection ports 16h, all the locations on the substrate W may pass through the underside of any of the injection ports 16h, so that the adsorption probability of the precursor gas on the substrate W may be improved.

Figure 19:
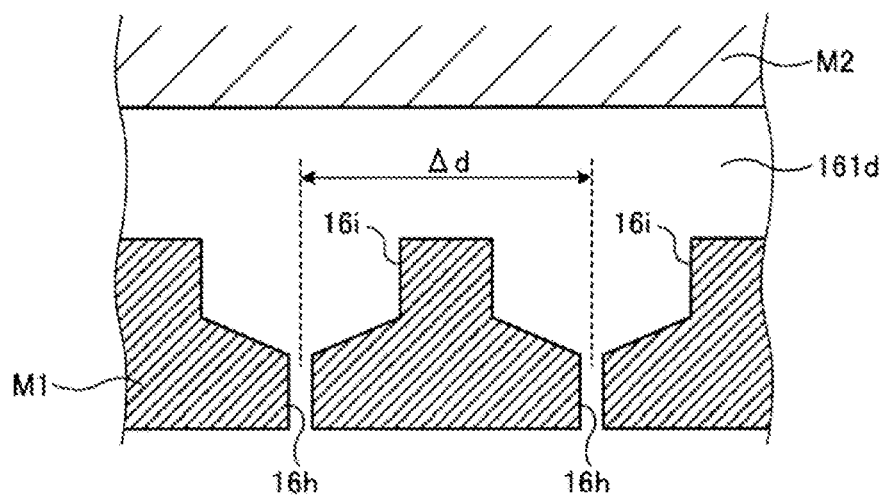
FIG. 19 is a sectional view illustrating an example of injection ports in an enlarged scale.

However, it is necessary for the first member M1 in which the injection ports 16h are formed to have a certain degree of thickness in order to maintain a mechanical strength. Since the sectional area of the opening of each of the injection ports 16h is small, it is difficult to form the injection ports 16h in the first member M1 such that each of the injection ports 16h penetrates the first member M1 while maintaining its diameter, as it is. Therefore, at the rear surface side of the first member M1, auxiliary holes 16i having a diameter larger than the injection ports 16h are formed, for example, as illustrated in FIG. 19. In addition, it is necessary to keep a certain degree of distance between the adjacent auxiliary holes 16i in order to maintain the mechanical strength of the first member M1. Therefore, every adjacent injection ports 16h are arranged in the bottom surface of the unit U at intervals of Δd or more, for example, as illustrated in FIG. 19.

Figure 20:
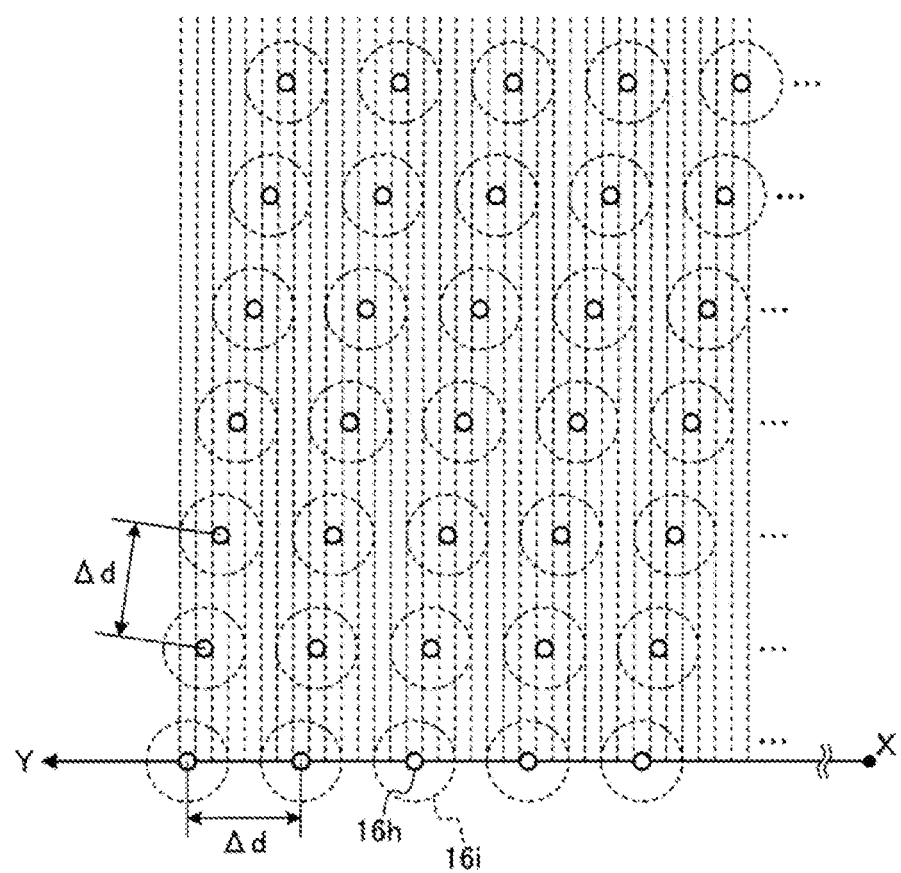
FIG. 20 is a schematic view for explaining an example of an arrangement of injection ports.

It may be considered to arrange the injection ports 16h to be shifted with respect to a direction perpendicular to the Y axis in the bottom surface of the unit U, for example, as illustrated in FIG. 20 in order to arrange the adjacent injection ports 16h at intervals of Δd or more, and to arrange the injection ports 16h with no gap in the Y axis direction. Accordingly, when the substrate W is moved in the direction perpendicular to the Y axis, the trajectories of the injection ports 16h on the substrate W are arranged with no gap on the line segments parallel to the Y axis on the substrate W.

Figure 21:
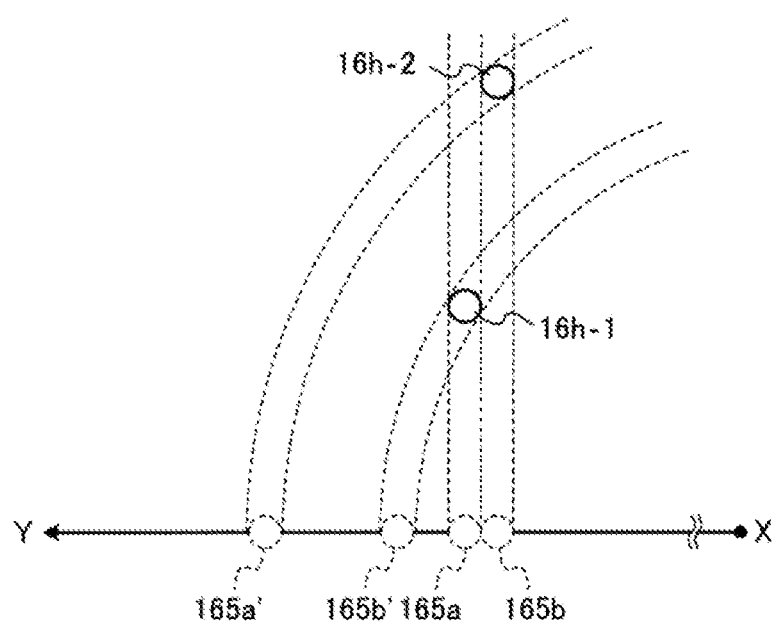
FIG. 21 is a schematic view for explaining an example of locations of injection ports in which a substrate passes.

However, in the present exemplary embodiment, the substrate W placed on the mounting table 14 is rotated around the axis X. Therefore, for example, as illustrated in FIG. 21, when a plurality of injection ports 16h-1 and 16h-2 are arranged, respectively, to be shifted with respect to the direction perpendicular to the Y axis, the trajectories of the injection ports 16h-1 and 16h-2 on the substrate W that has been rotated around the axis X may be located at locations 165a' and 165b', respectively, instead of locations 165a and 165b, on the line segments parallel to the Y axis on the substrate W. Therefore, the trajectories of the injection ports 16h on the substrate W may be located at overlapping locations or may have vacant gaps on the line segments parallel to the Y axis on the substrate W.

Figure 22:
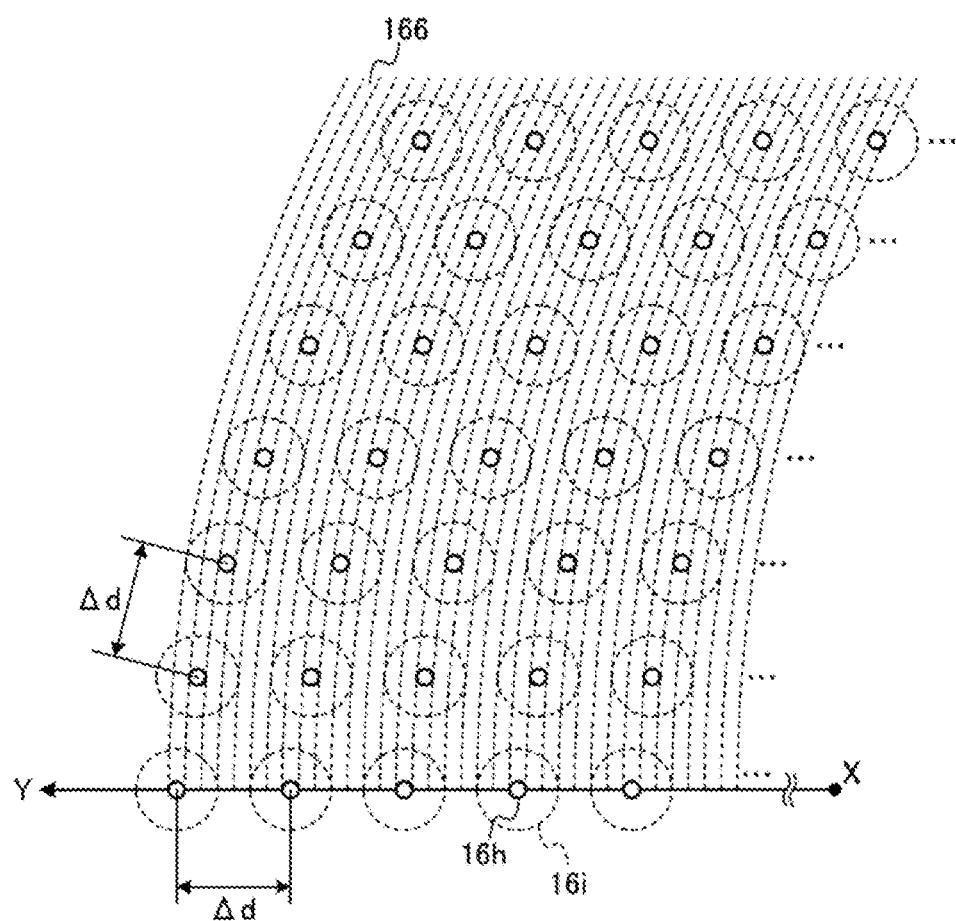
FIG. 22 is a schematic view for explaining an example of an arrangement of injection ports.

Therefore, in the injection section 16a in the present exemplary embodiment, for example, as illustrated in FIG. 22, the adjacent injection ports 16h are arranged at intervals of Δd or more along a circumference with the axis X as a center. One injection port 16h is arranged in each of a plurality of annular regions 166 with the axis X as a center. The radius of the outer circumference of each of the annular regions 166 is substantially the same as the radius of the inner circumference of its adjacent annular region 166. The width of each annular region 166 is substantially the same as the diameter of the injection port 16h disposed within the annular region 166. Each annular region 166 is an example of a second annular region. Accordingly, when the substrate W is moved in the direction of the rotation around the axis X, the trajectories of the injection ports 16h on the substrate W are arranged with no gap on the line segments parallel to the Y axis on the substrate W, for example, as illustrated in FIG. 18.

In the unit U in the present exemplary embodiment, for example, as illustrated in FIG. 6, a gap of about several millimeters is present in the Y axis direction between the inside injection section 161a and the intermediate injection section 162a, and between the intermediate injection section 162a and the outside injection section 163a. Therefore, when the substrate W passes through the underside of the injection section 16a, the adsorption probabilities of the precursor gas may be slightly different at the positions on the substrate W which pass through the underside of the inside injection section 161a, the intermediate injection section 162a, or the outside injection section 163a, and at the positions on the substrate W which pass through the underside of a portion between the inside injection section 161a and the intermediate injection section 162a, or a portion between the intermediate injection section 162a and the outside injection section 163a. Therefore, even in the portion between the inside injection section 161a and the intermediate injection section 162a, and in the portion between the intermediate injection section 162a and the outside injection section 163a, it is desirable that the trajectories of the injection ports 16h on the substrate W are arranged with no gap on the line segments parallel to the Y axis on the substrate W when the substrate W is moved in the direction of the rotation around the axis X.

Figure 23:
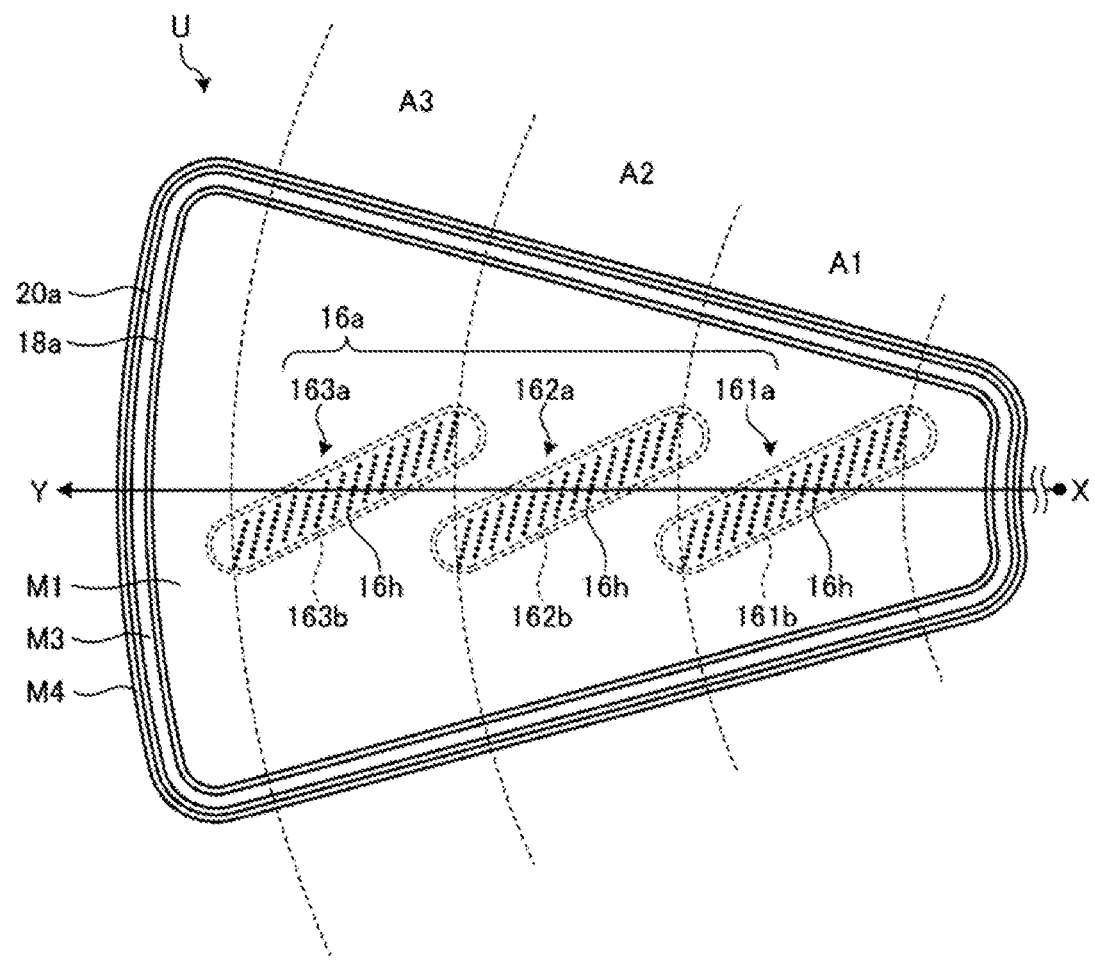
FIG. 23 is a view illustrating another example of an arrangement of injection ports.
Figure 24:
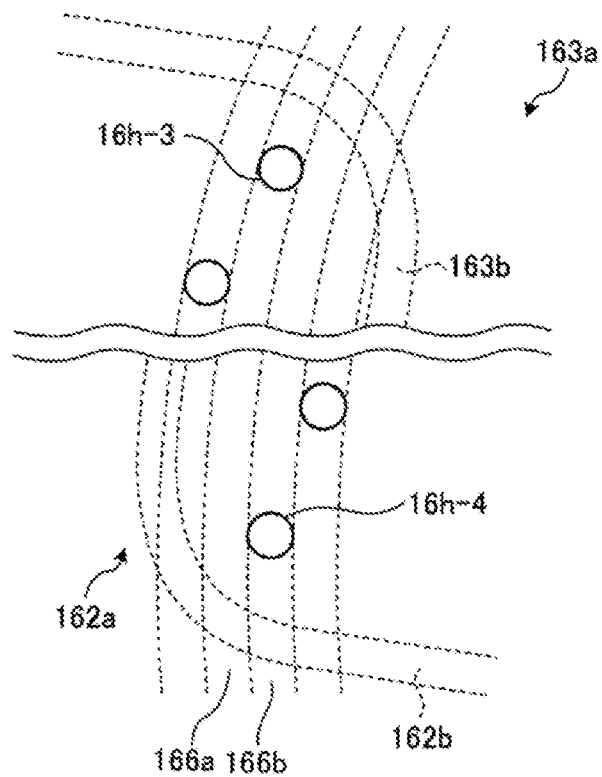
FIG. 24 is a view illustrating another example of an arrangement of injection ports in an enlarged scale.

Therefore, for example, as illustrated in FIG. 23, it may be considered to set the arrangement directions of the inside injection section 161a, the intermediate injection section 162a, and the outside injection section 163a to be inclined with respect to the Y axis direction. In this case, for example, as illustrated in FIG. 24, an annular region 166a including an injection port 16h-3 arranged at a location closest to the axis X among the injection ports 16h included in the outside injection section 163a, and an annular region 166b including an injection port 16h-4 arranged at a location farthest from the axis X among the injection ports 16h included in the intermediate injection section 162a are arranged to be adjacent to each other. The radius of the inner circumference of the annular region 166a is the same as the radius of the outer circumference of the annular region 166b. Likewise, in the relationship between the intermediate injection section 162a and the inside injection section 161a, an annular region 166 including an injection port 16h arranged at a location closest to the axis X among the injection ports 16h included in the intermediate injection section 162a, and an annular region 166 including an injection port 16h arranged at a location farthest from the axis X among the injection ports 16h included in the inside injection section 161a are arranged to be adjacent to each other.

Accordingly, in the whole of the injection section 16a having the inside injection section 161a, when the substrate W is moved in the direction of the rotation around the axis X, the intermediate injection section 162a, and the outside injection section 163a, the trajectories of the injection ports 16h at all the locations on the substrate W are arranged with no gap on the line segments parallel to the Y axis on the substrate W. Accordingly, when the substrate W passes through the underside of the injection ports 16h, all locations on the substrate W pass through the underside of any of the injection ports 16h so that the adsorption probability of the elements of the precursor gas on the substrate W may be improved.

Figure 25:
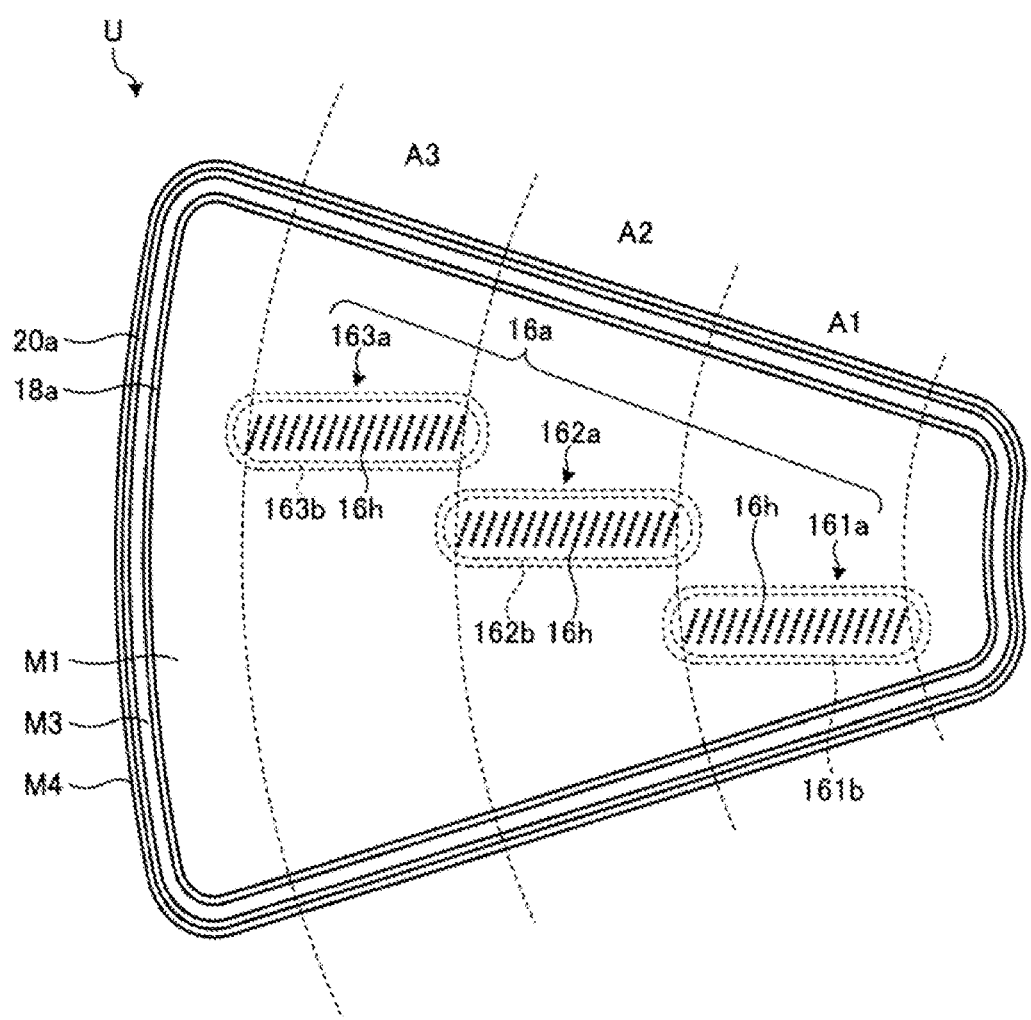
FIG. 25 is a view illustrating another example of an arrangement of injection ports.

In the unit U illustrated in FIGS. 23 and 24, by setting the arrangement direction of the inside injection section 161a, the intermediate injection section 162a, and the outside injection section 163a to be inclined with respect to the Y axis direction, the arrangement widths of the inside injection section 161a, the intermediate injection section 162a, and the outside injection section 163a in the bottom surface of the unit U may be narrowed in the rotation direction of the mounting table 14. When there is an extra space in the width of the bottom surface of the unit U, for example, as illustrated in FIG. 25, the inside injection section 161a, the intermediate injection section 162a, and the outside injection section 163a may be arranged to be shifted in the rotation direction of the mounting table 14.

Figure 26:
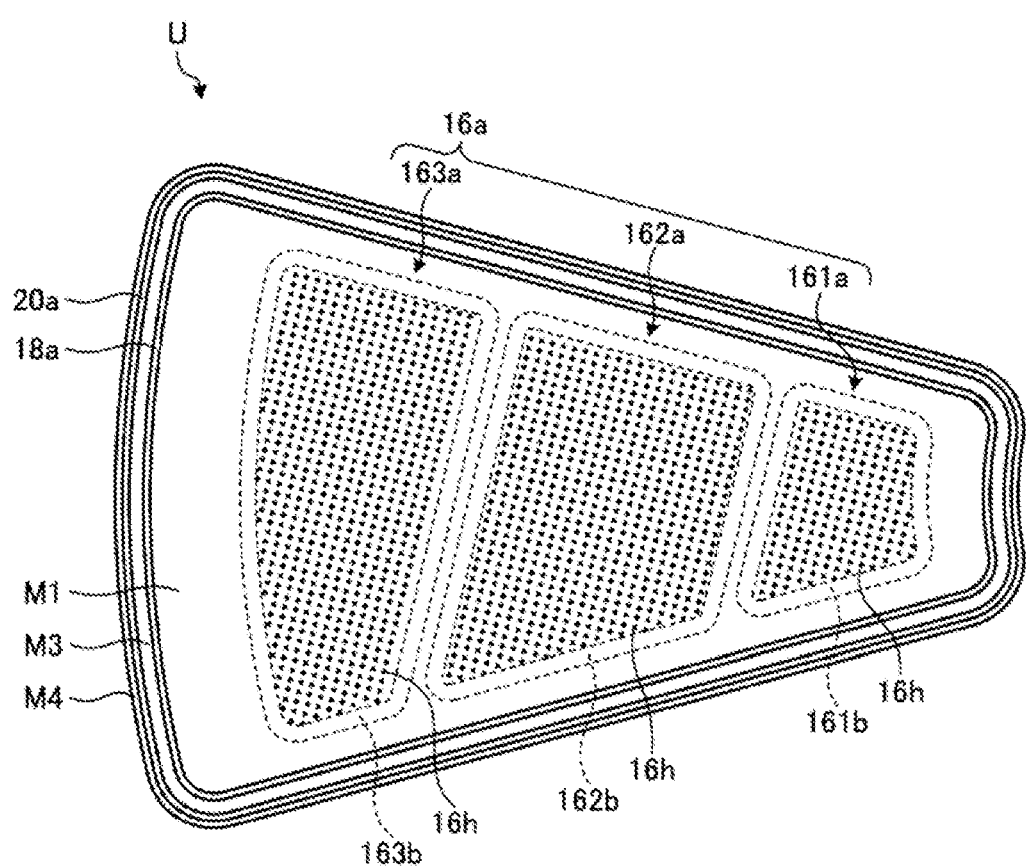
FIG. 26 is a view illustrating another example of an arrangement of injection ports.

For example, as illustrated in FIG. 26, the injection section 16a may be arranged in a fan-shaped region in the bottom surface of the unit U. In the unit U illustrated in FIG. 26, by arranging the injection section 16a in the fan-shaped region, the total number of the injection ports 16h is increased as compared to that of the unit U in FIG. 6. According to this, the precursor gas may be efficiently adsorbed on the substrate W. When the flow rate of the precursor gas injected from the whole of the injection section 16a is the same, the flow velocity of the precursor gas injected from each of the injection ports 16h of the unit U illustrated in FIG. 26 is reduced as compared to the flow velocity of the precursor gas injected from each of the injection ports 16h of the unit U of FIG. 6. In the example of FIG. 26, a plurality of injection ports may be present at locations having the same distances from the center of the axis X. The outside injection section 163a, the intermediate injection section 162a, and the inside injection section 161a may be provided such that the flow rates of the precursor gas of the respective injection sections may be independently controlled.

An exemplary embodiment has been described above. According to the film forming apparatus 10 of the present exemplary embodiment, the uniformity of the film thickness of the substrate W may be improved in the radial direction of the mounting table 14 from the rotation center of the mounting table 14.

In the exemplary embodiment described above, the injection section 16a provided in the bottom surface of the unit U is divided into three sections of the inside injection section 161a, the intermediate injection section 162a, and the outside injection section 163a, but the disclosed technology is not limited thereto. In other forms, the injection section 16a provided in the bottom surface of the unit U may be divided into two, or four or more. Then, each of the flow rates of the precursor gas injected from the injection ports 16h of the respective divided injection sections 16a may be independently controlled, or the flow rates of the precursor gas injected from the injection ports 16h of the two or more divided injection sections 16a may be controlled to be the same. Even in this case, it is desirable that the respective divided injection sections 16a are arranged on the bottom surface of the unit U such that the trajectories of the injection ports 16h on the substrate W are arranged with no gap on the line segments parallel to the Y axis on the substrate W when the substrate W is moved in the direction of the rotation around the axis X.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A film forming apparatus comprising:
a mounting table configured to place a substrate to be processed thereon, and provided to be rotatable around an axis such that the substrate is moved around the axis;
a shower head provided in one region among a plurality of regions, through which the substrate sequentially passes while moving in a circumferential direction around the axis due to rotation of the mounting table, such that a bottom surface of the shower head faces the mounting table, the shower head including a first shower head plate and a second shower head plate stacked above the first shower head plate, the first shower head plate and the second shower plate forming at least a first buffer space and a second buffer space therebetween, wherein the first buffer space is surrounded by a first elastic seal and the second buffer space is surrounded by a second elastic seal such that both the first elastic seal and the second elastic seal separate the first buffer space from the second buffer space; and
a flow rate controller configured to independently control a flow rate of a process gas to be supplied to each of the first buffer space and the second buffer space,
wherein the shower head further includes:
a plurality of first injection ports formed in the first shower head plate and communicated with the first buffer space and configured to downwardly inject the process gas supplied to the first buffer space; and
a plurality of second injection ports formed in the first shower head plate and communicated with the second buffer space and configured to downwardly inject the process gas supplied to the second buffer space,
wherein the first injection ports are arranged as a first array in a first region of the first shower head plate, wherein each of the first injection ports is positioned at an intersection of one of a first set of parallel straight lines and one of a second set of annular circular lines, and the second injection ports are arranged as a second array in a second region of the first shower head plate, wherein each of the second injection ports is positioned at an intersection of one of a third set of parallel straight lines and one of a fourth set of annular circular lines.

2. The film forming apparatus of claim 1, wherein each of the first injection ports and each of the second injection ports are provided at locations, of which distances from the axis in the first shower head plate are different from each other by a diameter of each of the first injection ports or each of the second injection ports.

3. The film forming apparatus of claim 1, wherein in the first shower head plate, a distance between each adjacent first injection ports or between each adjacent second injection ports is longer than a diameter of each of the first injection ports or each of the second injection ports.

4. The film forming apparatus of claim 1, wherein the shower head further includes a third buffer space formed between the first shower head plate and the second shower head plate,
in the first shower head plate, a plurality of third injection ports communicated with the third buffer space and configured to downwardly inject the process gas supplied to the third buffer space are formed,
a distance of each of the third injection ports from the axis is longer than that of each of the first injection ports and each of the second injection ports, and
the flow rate controller controls a flow rate of the process gas to be supplied to the first buffer space and the third buffer space to be larger than a flow rate of the process gas to be supplied to the second buffer space.

5. The film forming apparatus of claim 4, wherein among the plurality of first injection ports, a first injection port closest to the axis is formed inside an inner circumference of a region through which the substrate on the mounting table passes when viewed from a direction along the axis, and
among the plurality of third injection ports, a third injection port farthest from the axis is formed outside an outer circumference of a region through which the substrate on the mounting table passes when viewed from a direction along the axis.

6. The film forming apparatus of claim 1, wherein an inert gas is supplied to at least any one of the first buffer space or the second buffer space, instead of or together with the process gas, and
the flow rate controller controls a flow rate of the inert gas.

7. The film forming apparatus of claim 1, wherein an inert gas together with the process gas is supplied to at least any one of the first buffer space or the second buffer space, and
the flow rate controller controls a flow rate ratio of the inert gas to the process gas.

8. The film forming apparatus of claim 1, wherein when viewed from a direction along the axis, a region corresponding to the first buffer space and a region corresponding to the second buffer space include regions having the same distance from the axis, respectively.

9. The film forming apparatus of claim 1, wherein the first set of parallel straight lines are parallel to the third set of parallel straight lines, and wherein a radius of an outer circumference of an annular region including an injection port arranged at a location farthest from the axis among the first injection ports is the same as a radius of an inner circumference of an annular region including an injection port arranged at a location closest to the axis among the second injection ports.

10. The film forming apparatus of claim 1, wherein the second set of annular circular lines and the fourth set of annular circular lines have a center at the axis.

11. The film forming apparatus of claim 1, wherein none of the first set of parallel straight lines and the third set of parallel straight lines points to the axis.

12. A shower head for use in a film forming apparatus, the film forming apparatus including: a mounting table configured to place a substrate to be processed thereon, and provided to be rotatable around an axis such that the substrate is moved around the axis; a shower head provided in one region among a plurality of regions, through which the substrate sequentially passes while moving in a circumferential direction around the axis due to rotation of the mounting table, such that a bottom surface of the shower head faces the mounting table, the shower head including a first shower head plate and a second shower head plate stacked above the first shower head plate, the first shower head plate and the second shower plate forming at least a first buffer space and a second buffer space therebetween, wherein the first buffer space is surrounded by a first elastic seal and the second buffer space is surrounded by a second elastic seal; and a flow rate controller configured to independently control a flow rate of a process gas to be supplied to each of the first buffer space and the second buffer space, wherein the first buffer space is surrounded by a first elastic seal and the second buffer space is surrounded by a second elastic seal such that both the first elastic seal and the second elastic seal separate the first buffer space from the second buffer space,
the shower head further comprising:
a plurality of first injection ports formed in the first shower head plate and communicated with the first buffer space and configured to downwardly inject the process gas supplied to the first buffer space; and
a plurality of second injection ports formed in the second shower head plate and communicated with the second buffer space and configured to downwardly inject the process gas supplied to the second buffer space,
wherein all the first injection ports are provided at a location closer to the axis, as compared to the second injection ports,
the first injection ports are arranged as a first array in a first region of the first shower head plate, wherein each of the first injection ports is positioned at an intersection of one of a first set of parallel straight lines and one of a second set of annular circular lines, and the second injection ports are arranged as a second array in a second region of the first shower head plate, wherein each of the second injection ports is positioned at an intersection of one of a third set of parallel straight lines and one of a fourth set of annular circular lines.

13. The shower head of claim 12, wherein the first set of parallel straight lines are parallel to the third set of parallel straight lines, and wherein a radius of an outer circumference of an annular region including an injection port arranged at a location farthest from the axis among the first injection ports is the same as a radius of an inner circumference of an annular region including an injection port arranged at a location closest to the axis among the second injection ports.

14. The shower head of claim 12, wherein the second set of annular circular lines and the fourth set of annular circular lines have a center at the axis.

15. The shower head of claim 12, wherein none of the first set of parallel straight lines and the third set of parallel straight lines points to the axis.

* * * * *